US008938312B2

(12) United States Patent
Millington et al.

(10) Patent No.: US 8,938,312 B2
(45) Date of Patent: Jan. 20, 2015

(54) SMART LINE-IN PROCESSING

(75) Inventors: Nicholas Millington, Santa Barbara, CA (US); Tom Cullen, Santa Barbara, CA (US); Robert Reimann, Santa Barbara, CA (US); Brent Lehman, Santa Barbara, CA (US)

(73) Assignee: Sonos, Inc., Santa Barbara, CA (US)

( * ) Notice: Subject to any disclaimer, the term of this patent is extended or adjusted under 35 U.S.C. 154(b) by 918 days.

(21) Appl. No.: 13/089,167

(22) Filed: Apr. 18, 2011

(65) Prior Publication Data
US 2012/0263318 A1 Oct. 18, 2012

(51) Int. Cl.
*G06F 17/00* (2006.01)
*G11B 27/10* (2006.01)
*H03G 3/10* (2006.01)
*H03G 3/30* (2006.01)

(52) U.S. Cl.
CPC .................. *G11B 27/10* (2013.01); *H03G 3/10* (2013.01); *H03G 3/3026* (2013.01)
USPC ....................................................... 700/94

(58) Field of Classification Search
USPC ........................................................ 700/94
See application file for complete search history.

(56) References Cited

U.S. PATENT DOCUMENTS

| 6,999,827 | B1 * | 2/2006 | Yong ............................ 700/94 |
| 7,302,468 | B2 * | 11/2007 | Wijeratne ...................... 709/205 |
| 7,728,911 | B2 * | 6/2010 | Lacy et al. ..................... 348/706 |
| 7,908,637 | B2 * | 3/2011 | Kwon et al. ................... 725/139 |
| 7,930,644 | B2 * | 4/2011 | Silva et al. .................... 715/771 |
| 8,054,987 | B2 * | 11/2011 | Seydoux ......................... 381/79 |
| 8,055,363 | B2 * | 11/2011 | Lee ................................. 700/94 |
| 8,275,307 | B2 * | 9/2012 | Doyle, III .................... 455/3.06 |
| 8,639,370 | B2 * | 1/2014 | Torrini et al. ................... 700/94 |
| 2002/0072816 | A1 * | 6/2002 | Shdema et al. ................. 700/94 |
| 2002/0098878 | A1 * | 7/2002 | Mooney et al. ............... 455/569 |
| 2003/0023329 | A1 * | 1/2003 | Brooks et al. .................. 700/94 |
| 2004/0031853 | A1 | 2/2004 | Peng |
| 2004/0081099 | A1 * | 4/2004 | Patterson et al. ............. 370/241 |
| 2004/0239816 | A1 * | 12/2004 | Ando ............................. 348/705 |
| 2005/0100174 | A1 * | 5/2005 | Howard et al. ................. 381/86 |
| 2005/0281138 | A1 * | 12/2005 | Shimozawa et al. ........ 369/30.04 |
| 2006/0029005 | A1 * | 2/2006 | Slemmer et al. ............. 370/270 |
| 2006/0089735 | A1 * | 4/2006 | Atkinson ........................ 700/94 |
| 2006/0229752 | A1 * | 10/2006 | Chung ............................ 700/94 |

(Continued)

FOREIGN PATENT DOCUMENTS

| JP | 2001210019 | 8/2001 |
| JP | 2003045166 | 2/2003 |
| JP | 2006217116 | 8/2006 |
| JP | 2007323789 | 12/2007 |
| KR | 20040031853 | 4/2004 |

OTHER PUBLICATIONS

International Searching Authority, "Search Report," issued in connection with International Application Serial No. PCT/US12/33946, mailed on Aug. 13, 2012, 3 pages.

(Continued)

*Primary Examiner* — Paul McCord
(74) *Attorney, Agent, or Firm* — Hanley, Flight and Zimmerman, LLC

(57) ABSTRACT

Technology for smart line-in processing in an audio environment is disclosed. Particularly, the embodiments described herein provide automated source switching in an audio environment where a number of audio sources may exist and volume control.

19 Claims, 22 Drawing Sheets

(56) References Cited

U.S. PATENT DOCUMENTS

2010/0054709 A1 3/2010 Misawa et al.
2010/0274372 A1* 10/2010 Nielsen et al. .................. 700/94

OTHER PUBLICATIONS

International Searching Authority, "Written Opinion," issued in connection with International Application Serial No. PCT/US12/33946, mailed on Aug. 13, 2012, 7 pages.

International Bureau, "International Preliminary Report on Patentability", issued in connection with International patent application No. PCT/US2012/033946, mailed on Oct. 22, 2013, 8 pages.

"Response to the Written Opinion of the International Searching Authority", issued in connection with European Patent application No. 127179991, dated Jun. 30, 2014, 9 pages.

Japanese Patent Office, "Office action", issued in connection with Japanese patent application No. 2014-506484, issued on Oct. 28, 2014, 5 pages.

\* cited by examiner

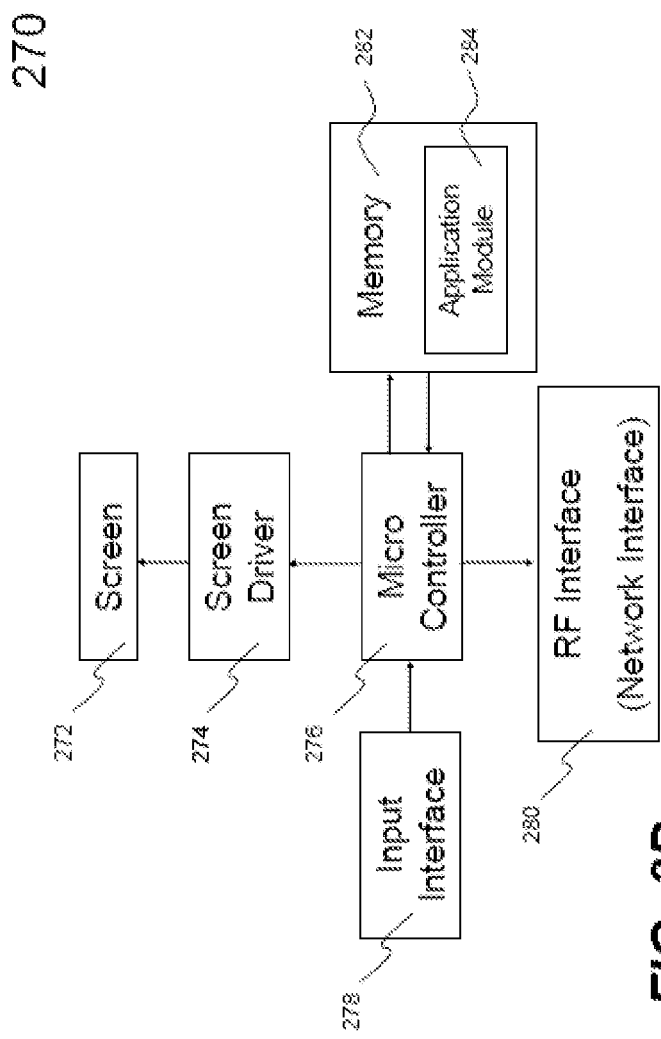

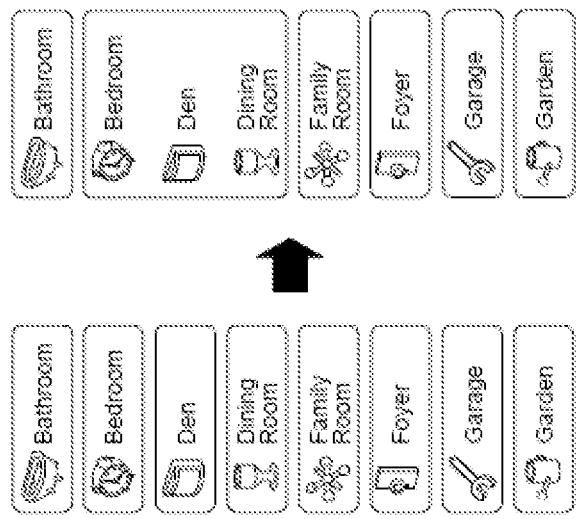

SMART LINE-IN PROCESSING

BACKGROUND

The presently described technology is directed towards technology for use in the area of consumer electronics. In particular, certain embodiments are directed to smart line-in processing for use in an audio environment.

Music is very much a part of our everyday lives. And thanks to the advancement of technology, music content is now more accessible than ever. The same can be said of other types of media, such as television, movies, and other audio and video content. In fact, now a user can even access the content over the Internet through an online store, an Internet radio station, online music service, online movie service, and the like, in addition to the more traditional means of accessing audio and video content.

The demand for such audio and video content continues to surge. Given the high demand over the years, technology used to access and play such content has likewise improved. Even still, technology used in accessing the content and the play back of such content can be significantly improved or developed in ways that the market or end users may not anticipate.

BRIEF DESCRIPTION OF THE DRAWINGS

These and other features, aspects, and advantages of the presently described technology will become better understood by a person skilled in the art with regard to the following description, appended claims, and accompanying drawings where:

FIG. 2D shows an example internal functional block diagram of a controller in accordance with certain embodiments;

FIG. 3B shows that a user defines multiple groups to be gathered at the same time;

Figure 1:
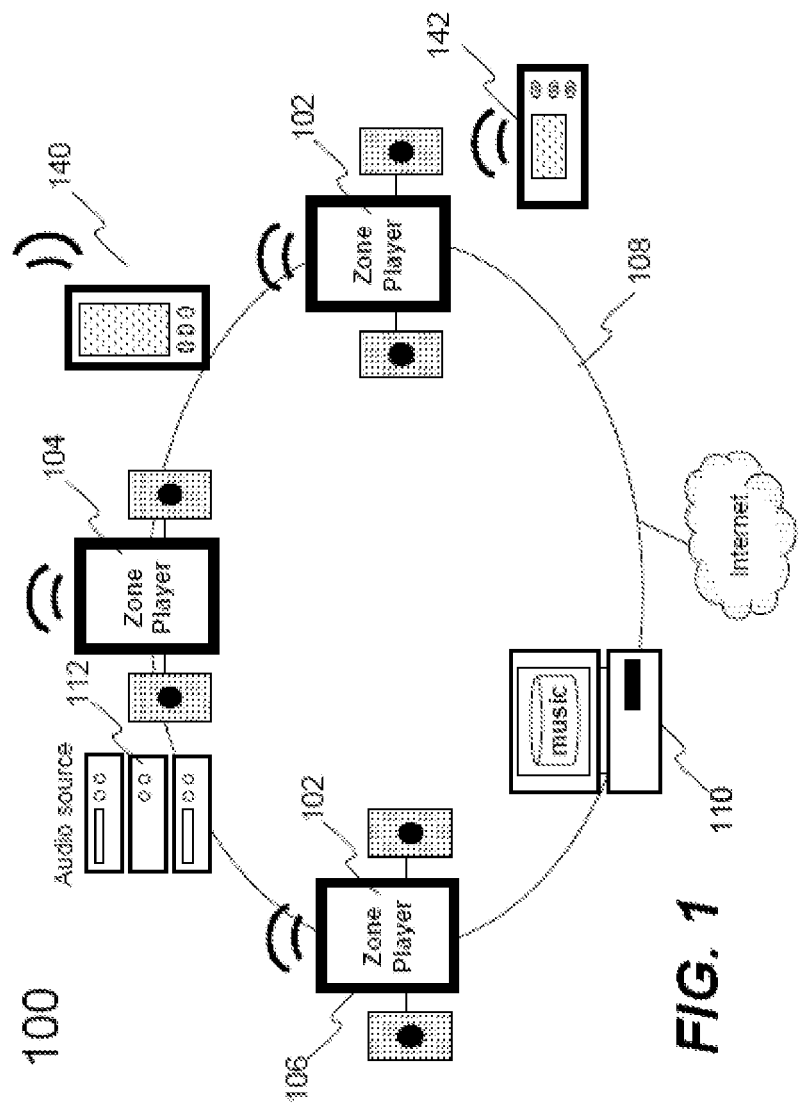
FIG. 1 shows an illustrative configuration in which certain embodiments may be practiced.

In addition, the drawings are for the purpose of illustrating certain embodiments, but it is understood that the inventions are not limited to the arrangements and instrumentality shown in the drawings.

DETAILED DESCRIPTION

I. Overview

The embodiments described herein relate to smart line-in processing. The embodiments are particularly useful in a networked environment where a playback device is capable of playing audio data from two or more different sources, and at least one of the sources receives its audio data from an audio device via a line-in connection. An advantage of certain embodiments described herein, among many other advantages, is that a listener can control the audio device itself and let the system detect a line-in signal and automatically switch the source of the playback device to play from the audio device. As such, the listener does not have to manually switch the source of the playback device before playing the audio device. Another advantage of certain embodiments described herein is that the system may allow the listener to switch the playback device to a different source even while the line-in signal is still present. Yet another advantage of certain embodiments described herein is that the system is capable of rearming itself such that the system can switch the source back to the audio device, should the system once again detect the line-in signal. The embodiments may also find utility in connection with any environment for which multi-source playback is desired.

In certain embodiments, a playback device is idle and therefore not producing sound or the playback device is configured to receive and play a first audio data stream from a first source. The playback device is further capable to receive and play a second audio data stream from a second source. The second source is coupled to an audio device through a line-in connector on the second source. A listener commands the audio device to play audio. The second source is configured, such that when a signal is detected on the line-in connector, the second source automatically switches the playback device to play audio from the audio device via the second audio data stream. The switch to play audio from the audio device may optionally be performed only after the second source detects a signal on the line-in connector for a threshold time. The playing of the second audio data stream may override the playing of the first audio data stream. The playback device and any of the first source and second source may be components of a single apparatus, or the playback device may be separate from any of the first source and second source and communicate with one another, such as over a network.

In certain embodiments, a playback device is configured to receive and play audio from a source, where the source receives the audio from an audio device coupled to the source via a line-in connector. During play of the audio from the audio device, a listener commands the playback device to play a new audio data stream from a different source. Upon receipt of the command, the playback device switches to play the new audio data stream. The playback device subsequently instructs the source to stop sending the audio of the audio device to the playback device. The source stops sending the audio to the playback device and waits until it no longer detects a signal on its line-in connector for an interval of time. When a signal is not detected on the line-in connector for the interval of time, the source is ready to automatically switch the playback device to play audio from the audio device, should the source once again detect a signal on its line-in connector. The playback device and any of the source and the different source may be components of a single apparatus, or the playback device may be separate from any of the source and the different source and communicate with one another, such as over a network.

In certain embodiments, the playback device is configured to output audio data according to a first volume level. When the playback device is automatically switched to play audio from a new source, where the new source receives the audio from an audio device coupled to the new source via a line-in connector, the volume of the playback device is modified to a second volume level. The second volume level is set such that increased dynamic range is given to a volume control of the audio device connected via line-in to the new source. When the playback device switches to play audio from a source that is different from the new source having the line-in connector, the volume of the playback device is returned to a safe volume level such that the audio is not played back to the listener at a high level.

In certain embodiments, a playback device comprises a network interface, a processor, and optionally, any of: an amplifier and a speaker driver. The network interface may be configured to receive and transmit audio data over a network. The amplifier, if the playback device is so equipped, powers the optional speaker driver. The processor processes audio data to be sent to another device for actual playback, output through the speaker driver if the playback device is so configured, or both. The playback device further comprises a line-in connector for receiving audio from an audio device. The playback device may implement automatic source switching, such that when a signal is detected on the line-in connector, the playback device automatically triggers the audio from the audio device to be played by the playback device itself, to be played by another device in communication with this playback device, or by both. The automatic switch to play audio from the audio device may optionally be performed only after a signal is detected on the line-in connector for a threshold time.

In certain embodiments, a playback device comprises a network interface, a processor, an amplifier, and a speaker driver. The network interface may be configured to receive and transmit audio data over a network. The amplifier powers the speaker driver. The processor processes audio data to be output through the speaker driver. The playback device may be automatically switched to play streaming audio data that is received from a source device. The source device includes a line-in connector, through which an audio device is connected. When a signal is detected on the line-in connector of the source device, thereby indicating that a listener wishes to hear audio from the audio device, the playback device receives a command from the source device to automatically play the streaming audio data from the audio device. The automatic switch to play audio from the audio device may optionally be performed only after a signal is detected on the line-in connector for a threshold time.

These embodiments and many additional embodiments are described more below. Further, the detailed description is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth in order to provide a thorough understanding of the present invention. However, it is understood to those skilled in the art that certain embodiments of the present invention may be practiced without certain, specific details. In other instances, well known methods, procedures, components, and circuitry have not been described in detail to avoid unnecessarily obscuring aspects of the embodiments.

Reference herein to "embodiment" means that a particular feature, structure, or characteristic described in connection with the embodiment can be included in at least one embodiment of the invention. The appearances of this phrase in various places in the specification are not necessarily all referring to the same embodiment, nor are separate or alternative embodiments mutually exclusive of other embodiments. The embodiments described herein, explicitly and implicitly understood by one skilled in the art, may be combined with other embodiments.

II. Example Environment

Referring now to the drawings, in which like numerals may refer to like parts throughout the several views. FIG. 1 shows an exemplary configuration 100 in which certain embodiments may be practiced. The configuration 100 may represent, but not be limited to, a part of a residential home, a business building, or a complex with multiple zones. There are a number of multimedia players of which three examples 102, 104 and 106 are shown as audio devices. Each of the audio devices may be installed or provided in one particular area or zone and hence referred to as a zone player herein. It is understood that a zone can comprise more than one zone player.

As used herein, unless explicitly stated otherwise, an audio source or audio sources are generally in digital format and can be transported or streamed over a data network. To facilitate the understanding of the example environment of FIG. 1, it is assumed that the configuration 100 represents a home. Though, it is understood that this technology is not limited to its place of application. Referring back to FIG. 1, the zone players 102 and 104 may be located in one or two of the bedrooms while the zone player 106 may be installed or positioned in a living room. All of the zone players 102, 104, and 106 are coupled directly or indirectly to a data network 108. In addition, a computing device 110 is shown to be coupled on the network 108. In reality, any other device such as a home gateway device, a storage device, or an MP3 player may be coupled to the network 108 as well.

The network 108 may be a wired network, a wireless network or a combination of both. In one example, all devices including the zone players 102, 104, and 106 are coupled to the network 108 by wireless means based on an industry standard such as IEEE 802.11. In yet another example, all devices including the zone players 102, 104, and 106 are part of a local area network that communicates with a wide area network (e.g., the Internet). In still another example, all devices including the zone players 102, 104 and 106 and a controller 142 forms an ad-hoc network and may be specifically named, e.g., a household identifier: Smith Family, to be differentiated from a similar neighboring setup with a household identifier, e.g., Kallai Family.

Many devices on the network 108 are configured to download and store audio sources. For example, the computing device 110 can download audio sources, such as music or audio associated with videos, from the Internet (e.g., the "cloud") or some other source and store the downloaded audio sources locally for sharing with other devices on the Internet or the network 108. The computing device 110 or any of the zone players 102, 104, and 106 can also be configured to receive streaming audio. Shown as a stereo system, the device 112 is configured to receive an analog audio source (e.g., from broadcasting) or retrieve a digital audio source (e.g., from a compact disk). The analog audio sources can be converted to digital audio sources. In accordance with certain embodiments, the various audio sources may be shared among the devices on the network 108.

Two or more zone players (e.g., any two or more of the zone players 102, 104, and 106) may be grouped together to form a new zone group. Any combinations of zone players and an existing zone group may be grouped together. In one instance, a new zone group is formed by adding one zone player to another zone player or an existing zone group.

In certain embodiments, there are two or more zone players in one environment (e.g., a living room in a house). Instead of grouping these two zone players to play back the same audio source in synchrony, these two zone players may be configured to play two separate sounds in left and right channels. In other words, the stereo effects of a sound are reproduced or enhanced through these two zone players, one for the left sound and the other for the right sound. Likewise, for a 3-channel (or 2.1 sound effects) sound, three such zone players may be reconfigured as if there are three speakers: left and right speakers and a subwoofer to form a stereo sound. The details of the reconfiguring the zone players and operating these audio products are described more below. Similar configurations with multiple channels (greater than 3, such as 4, 5, 6, 7, 9 channels and so on) also apply. For example, configurations that use more than two channels may be useful in television and theater type settings, where video content such as in the form of television and movies is played together with audio content that contains more than two channels. Further, certain music might similarly be encoded with more than two channel sound.

In certain embodiments, two or more zone players may be consolidated to form a single, consolidated zone player. The consolidated zone player may further be paired with a single zone player or yet another consolidated zone player. A consolidated zone player may comprise one or more individual playback devices. Each playback device of a consolidated playback device is preferably set in a consolidated mode.

According to certain embodiments, one can continue to do any of: group, consolidate, and pair until a desired configuration is complete. The actions of grouping, consolidation, and pairing are preferably performed through a control interface and not by physically connecting and re-connecting speaker wire, for example, to individual, discrete speakers to create different configurations. As such, certain embodiments described herein provide a more flexible and dynamic platform through which sound reproduction can be offered to the end-user.

According to certain embodiments, a particular zone player (e.g., any of zone players 102, 104, and 106) may be configured to receive a first audio data stream from a first source. The first source might obtain the first audio data stream from any of a downloaded song(s) (e.g., a music file stored on an accessible hard-drive), Internet radio station, online music service, online movie service, and the like, in addition to the more traditional means of accessing audio and video content. The zone player may be further capable to receive and play a second audio data stream from a second source. The second source may be coupled to an audio device through a line-in connector on the second source. In certain embodiments, an audio device might include any of an audio signal source device, such as a record player, radio, cassette player, CD player, DVD player, etc. In certain embodiments, an audio source may include a wireless networking device, such as an AirPort Express, which is an audio device that is commercially offered for sale by Apple, Inc. The AirPort Express may provide streaming audio data to the line-in connection of the second source. Audio data from the AirPort Express device may be controlled via a graphical interface, such as an iTunes music player, which may be separate from a controller of the playback device or the second source. It is understood that the first and second sources may include zone players (e.g., any of zone players 102, 104, and 106).

A listener may command the audio device to play audio (e.g., without having to manually switch sources on the zone player). For example, if the audio device is an AirPort Express, a listener may use an AirPort-enabled computer or smart phone with an iTunes music player, for example, to command the audio device to play. The second source is configured, such that when a signal is detected on the line-in connector, the second source automatically switches the zone player to play audio from the audio device via the second audio data stream. The switch to play audio from the audio device may optionally be performed only after the second source detects a signal on the line-in connector for a threshold time. An example threshold time is 300 milliseconds or less, though any programmed time can work. The play back of the second audio data stream may override the play back of the first audio data stream. The zone player and any of the first source and second source may be components of a single apparatus, or the playback device may be separate from any of the first source and second source and communicate with one another, such as over a network.

At some later point in time, with the audio device connected to the second source via its line-in connector still playing, the listener may decide to play a new audio data stream from a different source and responsively input a command that is communicated to the zone player to play the new audio data stream. The zone player receives the command and switches to the listener's desired source and the new audio data stream is played. The zone player subsequently instructs the second source having the line-in connector to stop sending its audio data stream to the zone player. At this point, the second source waits until it no longer detects a signal on its line-in connector for an interval of time. An example interval of time is 13 seconds or less, though any programmed time can work. The second source is now armed (or rearmed) and once again ready to automatically switch the playback on the zone player to the audio data stream from the second source, should the second source once again detect a signal on its line-in connector from the audio device.

An advantage of certain embodiments described above is that the listener can control the audio device itself (e.g., such as by pressing "play" or "stop" on the audio device itself or by pressing "play" or "stop" on a graphical interface associated with the audio device) and let the system detect a line-in signal and automatically switch the source of the zone player, without requiring the listener from having to manually switch the zone player source.

Another advantage of certain embodiments described above is that the system may allow the listener to switch the playback device to a different source even while the line-in signal is still present.

Yet another advantage of certain embodiments described above is that the system is capable of rearming itself such that the system can switch the source back to the audio device, should the system once again detect the line-in signal.

According to some embodiments, a particular zone player (e.g., any of zone players 102, 104, and 106) is configured to output audio data according to a first volume level. When the zone player is automatically switched to play an audio data stream from a new source having a line-in connector, the volume of the zone player is modified to a second volume level. The second volume level is set such that increased dynamic range is given to a volume control of the line-in connected source. An example second volume level is 75 percent of total volume. When the zone player switches once again to play an audio stream from a source that is different from the new source having the line-in connector, the volume of the zone player is returned to a safe volume level such that that audio is not played back to the listener at a high level. An example safe volume level is 25 percent of total volume.

It is understood that the technology described herein is not limited to its place of application. For example, it is understood that zones and zone players, and the embodiments described herein, may also be used in vehicles, on water craft, airplanes, amphitheaters, outdoors, along the streets in a village or city, and so on, in addition to homes, offices, gyms, schools, hospitals, hotels, movie theaters, malls, stores, casinos, museum, entertainment parks, or any other place where audio content is played. As such, it will be appreciated that the embodiments described herein may be used in connection with any system or application for which a certain audio system configuration is desired.

III. Example Playback Devices

Figure 2A:
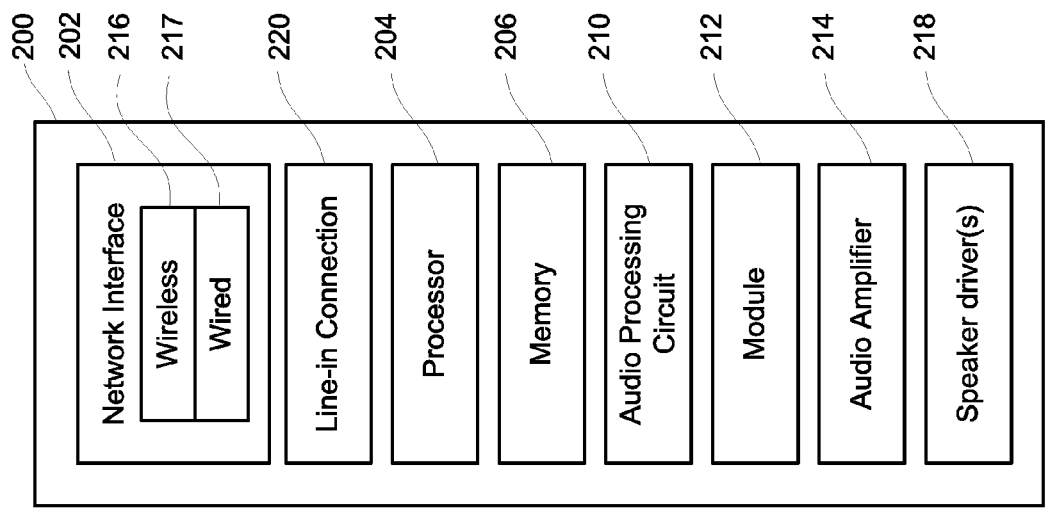
FIG. 2A shows an illustrative functional block diagram of a player in accordance with certain embodiments.

Referring now to FIG. 2A, there is shown an exemplary functional block diagram of a zone player 200 in accordance with an embodiment. The zone player 200 includes a network interface 202, line-in connection 220, processor 204, memory 206, audio processing circuit 210, module 212, optionally, audio amplifier 214 that may be internal or external, and optionally, speaker unit 218 connected to the audio amplifier 214. The network interface 202 facilitates a data flow between a data network (i.e., the data network 108 of FIG. 1) and the zone player 200 and typically executes a special set of rules (i.e., a protocol) to send data back and forth. One of the common protocols used in the Internet is TCP/IP (Transmission Control Protocol/Internet Protocol). In general, a network interface 202 manages the assembling of an audio source or file into smaller packets that are to be transmitted over the data network or reassembles received packets into the original source or file. In addition, the network interface 202 handles the address part of each packet so that it gets to the right destination or intercepts packets destined for the zone player 200. Accordingly, in certain embodiments, each of the packets includes an IP-based source address as well as an IP-based destination address.

The network interface 202 may include one or both of a wireless interface 216 and a wired interface 217. The wireless interface 216, also referred to as an RF interface, provides network interface functions by a wireless means for the zone player 200 to communicate with other devices in accordance with a communication protocol (such as the wireless standard IEEE 802.11a, 802.11b, 802.11g, 802.11n, or 802.15.1). The wired interface 217 provides network interface functions by a wired means (e.g., an Ethernet cable). In one embodiment, a zone player includes both of the interfaces 216 and 217, and other zone players include only a RF or wired interface. Thus these other zone players communicate with other devices on a network or retrieve audio sources via the zone player. The processor 204 is configured to control the operation of other parts in the zone player 200. The memory 206 may be loaded with one or more software modules that can be executed by the processor 204 to achieve desired tasks. According to one embodiment, a software module implementing an embodiment, such as described herein, is executed, the processor 204 operates in accordance with the software module in reference to a saved zone group configuration characterizing a zone group created by a user, the zone player 200 is caused to retrieve an audio source from another zone player or a device on the network and synchronize the players in the zone group to play back the audio source as desired. According to another embodiment, a software module implementing an embodiment described herein creates a pair between two or more zone players to create a desired multi-channel audio environment.

According to another embodiment, a software module implementing one or more embodiments described herein allows for automated source switching. For example, processor 204 operates in accordance with a software module for determining that an audio signal is present at the line-in connector 220 and responsively switches a source of a zone player or playback device to the audio device. Processor 204, in accordance with a software module, may further receive an instruction to stop the play back of audio data from the audio device even when the audio signal is present at the line-in connector 220. Processor 204, in accordance with a software module, may further determine that the audio signal is no longer present at the line-in connector 220 and responsively rearm, such that a subsequent presence of the audio signal will switch the source to the audio device.

Line-in connection 220 may include a socket for a jack plug or some other audio connector and may be coupled to the audio processing circuit 210. In certain embodiments, the line-in connection 220 includes a socket for any of a 0.25 inch plug, a 3.5 mm plug, and a 2.5 mm plug. An illustrative setup may include connecting an AirPort Express via its 3.5 mm stereo mini-jack connection to the zone player 200 via its 3.5 mm connection (e.g., line-in connection 220).

According to one embodiment, the memory 206 is used to save one or more saved zone configuration files that may be retrieved for modification at any time. Typically, a saved zone group configuration file is transmitted to a controller (e.g., the controlling device 140 or 142 of FIG. 1, a computer, a portable device, or a TV) when a user operates the controlling device. The zone group configuration provides an interactive user interface so that various manipulations or control of the zone players may be performed.

In certain embodiments, the audio processing circuit 210 resembles the circuitry in an audio playback device and includes one or more analog-to-digital converters (ADC), one or more digital-to-analog converters (DAC), an audio preprocessing part, an audio enhancement part or a digital signal processor and others. In operation, when an audio source is retrieved via the network interface 202, the audio source is processed in the audio processing circuit 210 to produce analog audio signals. The processed analog audio signals are then provided to the audio amplifier 214 for playback on speakers. In addition, the audio processing circuit 210 may include necessary circuitry to process analog signals as inputs to produce digital signals for sharing with other devices on a network.

Depending on an exact implementation, the module 212 may be implemented as a combination of hardware and software. In one embodiment, the module 212 is used to save a scene. The audio amplifier 214 is typically an analog circuit that powers the provided analog audio signals to drive one or more speakers.

It is understood that zone player 200 is an example of a playback device. Examples of playback devices include those zone players that are commercially offered for sale by Sonos, Inc. of Santa Barbara, Calif. They currently include a Zone- Player 90, ZonePlayer 120, and Sonos S5. The ZonePlayer 90 is an example zone player without a built-in amplifier, whereas the ZonePlayer 120 is an example zone player with a built-in amplifier. The S5 is an example zone player with a built-in amplifier and speakers. In particular, the S5 is a five-driver speaker system that includes two tweeters, two mid-range drivers, and one subwoofer. When playing audio content via the S5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies, just from different channels of audio. While the S5 is an example of a zone player with speakers, it is understood that a zone player with speakers is not limited to one with a certain number of speakers (e.g., five speakers as in the S5), but rather can contain one or more speakers. Further, a zone player may be part of another device, which might even serve a primary purpose different than audio.

IV. Example Controller

Figure 2B:
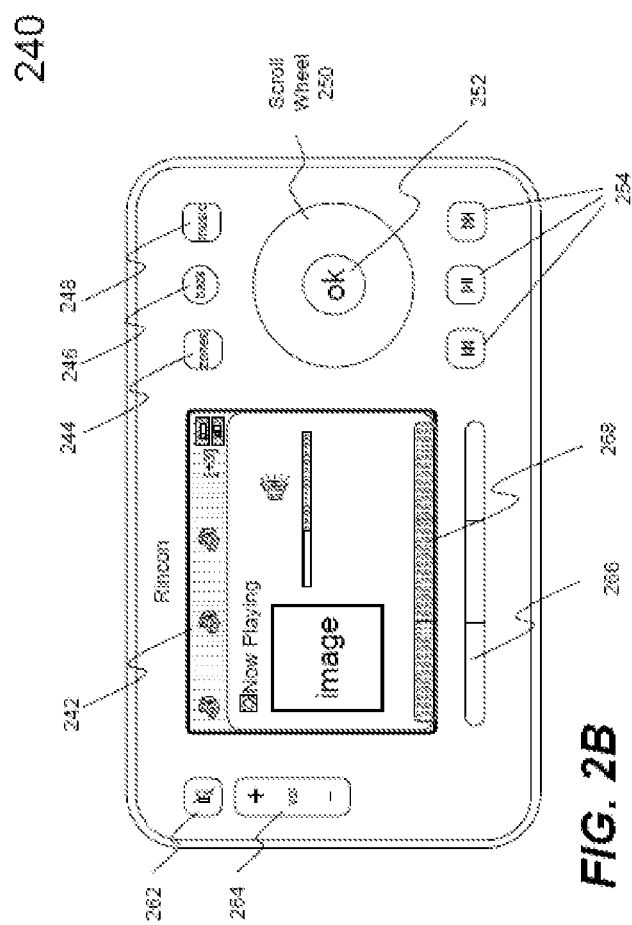
FIG. 2B shows an example of a controller that may be used to remotely control one or more players of FIG. 2A.

Referring now to FIG. 2B, there is shown an exemplary controller 240, which may correspond to the controlling device 140 or 142 of FIG. 1. The controller 240 may be used to facilitate the control of multi-media applications, automation and others in a complex. In particular, the controller 240 is configured to facilitate a selection of a plurality of audio sources available on the network, controlling operations of one or more zone players (e.g., the zone player 200) through a RF interface corresponding to the wireless interface 216 of FIG. 2A. According to one embodiment, the wireless means is based on an industry standard (e.g., infrared, radio, wireless standard IEEE 802.11a, 802.11b 802.11g, 802.11n, or 802.15.1). When a particular audio source is being played in the zone player 200, a picture, if there is any, associated with the audio source may be transmitted from the zone player 200 to the controller 240 for display. In one embodiment, the controller 240 is used to synchronize audio playback of more than one zone player by grouping the zone players in a group. In another embodiment, the controller 240 is used to control the volume of each of the zone players in a zone group individually or together.

In an embodiment, the controller 240 is used to create a pairing between two or more playback devices to create or enhance a multi-channel listening environment. For example, the controller 240 may be used to select and pair two or more playback devices. In addition, the controller 240 may be used to turn pairing on or off. The controller 240 may also be used to consolidate playback devices, and further to set a particular playback device in consolidated mode. Accordingly, in some embodiments, the controller 240 provides a flexible mechanism for dynamically configuring a multi-channel audio environment. In some instances, the pairing creates a multi-channel listening environment. In some instances, the pairing enhances a multi-channel listening environment by increasing the separation between devices. For example, two individual playback devices, which are positioned at a distance from each other, may provide more channel separation to the listener than the audio coming from only a single device.

The user interface for the controller 240 includes a screen 242 (e.g., a LCD screen) and a set of functional buttons as follows: a "zones" button 244, a "back" button 246, a "music" button 248, a scroll wheel 250, "ok" button 252, a set of transport control buttons 254, a mute button 262, a volume up/down button 264, a set of soft buttons 266 corresponding to the labels 268 displayed on the screen 242.

The screen 242 displays various screen menus in response to a user's selection. In one embodiment, the "zones" button 244 activates a zone management screen or "Zone Menu", which is described in more details below. The "back" button 246 may lead to different actions depending on the current screen. In one embodiment, the "back" button triggers the current screen display to go back to a previous one. In another embodiment, the 'back" button negates the user's erroneous selection. The "music" button 248 activates a music menu, which allows the selection of an audio source (e.g., a song) to be added to a zone player's music queue for playback.

The scroll wheel 250 is used for selecting an item within a list, whenever a list is presented on the screen 242. When the items in the list are too many to be accommodated in one screen display, a scroll indicator such as a scroll bar or a scroll arrow is displayed beside the list. When the scroll indicator is displayed, a user may rotate the scroll wheel 250 to either choose a displayed item or display a hidden item in the list. The "OK" button 252 is used to confirm the user selection on the screen 242.

There are three transport buttons 254, which are used to control the effect of the currently playing song. For example, the functions of the transport buttons may include play/pause and forward/rewind a song, move forward to a next song track, or move backward to a previous track. According to one embodiment, pressing one of the volume control buttons such as the mute button 262 or the volume up/down button 264 activates a volume panel. In addition, there are three soft buttons 266 that can be activated in accordance with the labels 268 on the screen 242. It is understood that, in a multi-zone system, there may be multiple audio sources being played respectively in more than one zone players. The music transport functions described herein shall apply selectively to one of the sources when a corresponding one of the zone players or zone groups is selected.

Figure 2C:
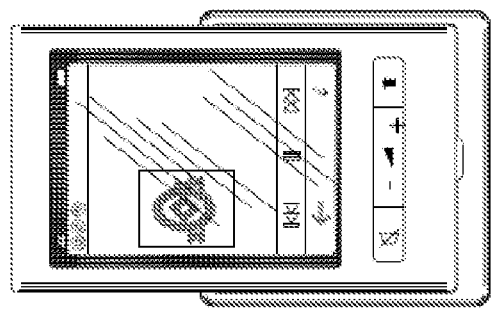
FIG. 2C shows an example of a controller that may be used to remotely control one or more players of FIG. 2A.

FIG. 2C shows an exemplary controller 260 which may correspond to the controlling device 140 or 142 of FIG. 1. The controller 260 is provided with a touch screen that allows a user to interact with the controller, for example, to navigate a playlist of many items, to control operations of one or more players. In one embodiment as it will be further shown in FIGS. 10A to 10F, a user may interact with the controller to make a multi-channel audio environment, such as create a stereo pair for example, and may even be used to separate the multi-channel audio environment, such as disengage a stereo pair. It should be noted that other network-enabled portable devices such as an iPhone, iPad or any other smart phone or network-enabled device may be used as a controller to interact or control multiple zone players in an environment (e.g., a networked computer such as a PC or Mac may also be used as a controller). According to one embodiment, an application may be downloaded into a network enabled device. Such an application may implement most of the functions discussed above for the controller 240 using a navigating mechanism or touch screen in the device. Those skilled in the art will appreciate the flexibility of such an application and its ability to be ported to a new type of portable device given the detailed description herein.

FIG. 2D illustrates an internal functional block diagram of an exemplary controller 270, which may correspond to the controller 240 of FIG. 2B, a computing device, smart phone, or any other communicative device. The screen 272 on the controller 270 may be an LCD screen. The screen 272 communicates with and is commanded by a screen driver 274 that is controlled by a microcontroller (e.g., a processor) 276. The memory 282 may be loaded with one or more application modules 284 that can be executed by the microcontroller 276 with or without a user input via the user interface 278 to achieve desired tasks. In one embodiment, an application module is configured to facilitate grouping a number of selected zone players into a zone group and synchronizing the zone players for one audio source. In another embodiment, an application module is configured to control together the audio sounds (e.g., volume) of the zone players in a zone group. In operation, when the microcontroller 276 executes one or more of the application modules 284, the screen driver 274 generates control signals to drive the screen 272 to display an application specific user interface accordingly, more of which will be described below.

The controller 270 includes a network interface 280 referred to as a RF interface 280 that facilitates wireless communication with a zone player via a corresponding RF interface thereof. In one embodiment, the commands such as volume control and audio playback synchronization are sent via the RF interfaces. In another embodiment, a saved zone group configuration is transmitted between a zone player and a controller via the RF interfaces. The controller 270 may control one or more zone players, such as 102, 104 and 106 of FIG. 1. Nevertheless, there may be more than one controller, each preferably in a zone (e.g., a room or rooms nearby each other) and configured to control any one and all of the zone players.

In one embodiment, a user creates a zone group including at least two zone players from the controller 240 that sends signals or data to one of the zone players. As all the zone players are coupled on a network, the received signals in one zone player can cause other zone players in the group to be synchronized so that all the zone players in the group play back an identical audio source or a list of identical audio sources in a timely synchronized manner such that no (or substantially no) audible delays or hiccups could be heard. Similarly, when a user increases the audio volume of the group from the controller, the signals or data of increasing the audio volume for the group are sent to one of the zone players and causes other zone players in the group to be increased together in volume and in scale.

According to one implementation, an application module is loaded in memory 282 for zone group management. When a predetermined key (e.g. the "zones" button 244) is activated on the controller 240, the application module is executed in the microcontroller 276. The input interface 278 coupled to and controlled by the microcontroller 276 receives inputs from a user. A "Zone Menu" is then displayed on the screen 272. The user may start grouping zone players into a zone group by activating a "Link Zones" or "Add Zone" soft button, or de-grouping a zone group by activating an "Unlink Zones" or "Drop Zone" button. The detail of the zone group manipulation will be further discussed below.

As described above, the input interface 278 includes a number of function buttons as well as a screen graphical user interface. It should be pointed out that the controller 240 in FIG. 2B is not the only controlling device that may practice the embodiments. Other devices that provide the equivalent control functions (e.g., a computing device, a hand-held device) may also be configured to practice the present invention. In the above description, unless otherwise specifically described, it is clear that keys or buttons are generally referred to as either the physical buttons or soft buttons, enabling a user to enter a command or data.

One mechanism for 'joining' zone players together for music playback is to link a number of zone players together to form a group. To link a number of zone players together, a user may manually link each zone player or room one after the other. For example, there is a multi-zone system that includes the following zones:
  Bathroom
  Bedroom
  Den
  Dining Room
  Family Room
  Foyer If a user wishes to link five of the six zone players using the current mechanism, the user may start with a single zone and then manually link each zone to that zone. This mechanism may be sometimes quite time consuming. According to one embodiment, a set of zones can be dynamically linked together using one command. Using what is referred to herein as a theme or a zone scene, zones can be configured in a particular scene (e.g., morning, afternoon, or garden), where a predefined zone grouping and setting of attributes for the grouping are automatically effectuated.

Figure 3A:
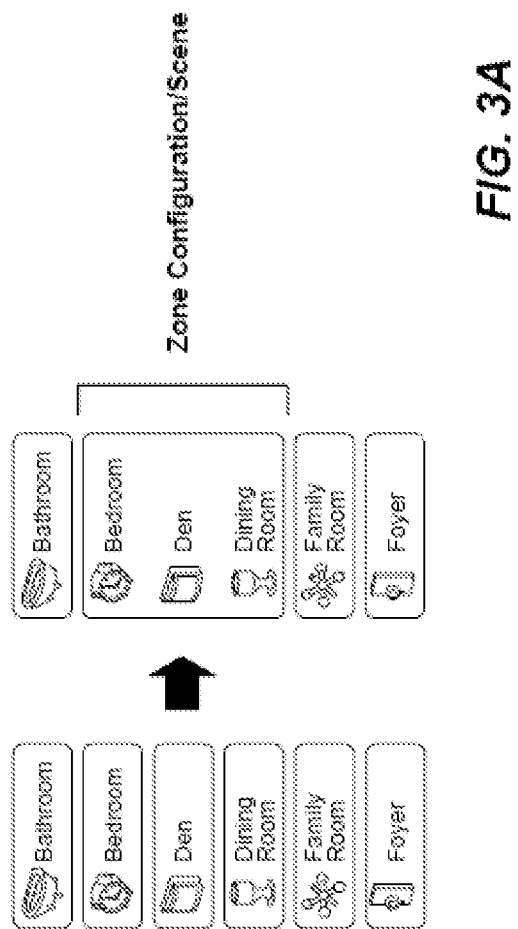
FIG. 3A provides an illustration of a zone scene configuration.

For instance, a "Morning" zone scene/configuration command would link the Bedroom, Den and Dining Room together in one action. Without this single command, the user would need to manually and individually link each zone. FIG. 3A provides an illustration of one zone scene, where the left column shows the starting zone grouping—all zones are separate, the column on the right shows the effects of grouping the zones to make a group of 3 zones named after "Morning".

Expanding this idea further, a Zone Scene can be set to create multiple sets of linked zones. For example, a scene creates 3 separate groups of zones, the downstairs zones would be linked together, the upstairs zones would be linked together in their own group, and the outside zones (in this case the patio) would move into a group of its own.

In one embodiment as shown in FIG. 3B, a user defines multiple groups to be gathered at the same time. For example: an "Evening Scene" is desired to link the following zones:
  Group 1
  Bedroom
  Den
  Dining Room
  Group 2
  Garage
  Garden
where Bathroom, Family Room and Foyer should be separated from any group if they were part of a group before the Zone Scene was invoked.

A feature of certain embodiments is that that zones do not need to be separated before a zone scene is invoked. In one embodiment, a command is provided and links all zones in one step, if invoked. The command is in a form of a zone scene. After linking the appropriate zones, a zone scene command could apply the following attributes:
  Set volumes levels in each zones (each zone can have a different volume)
  Mute/Unmute zones.
  Select and play specific music in the zones.
  Set the play mode of the music (Shuffle, Repeat, Shuffle-repeat)
  Set the music playback equalization of each zone (e.g., bass treble).

A further extension of this embodiment is to trigger a zone scene command as an alarm clock function. For instance the zone scene is set to apply at 8:00 am. It could link appropriate zones automatically, set specific music to play and then stop the music after a defined duration. Although a single zone may be assigned to an alarm, a scene set as an alarm clock provides a synchronized alarm, allowing any zones linked in the scene to play a predefined audio (e.g., a favorable song, a predefined playlist) at a specific time or for a specific duration. If, for any reason, the scheduled music failed to be played (e.g., an empty playlist, no connection to a share, failed UPnP, no Internet connection for an Internet Radio station), a backup buzzer will sound. This buzzer will be a sound file that is stored in a zone player.

Figure 4:
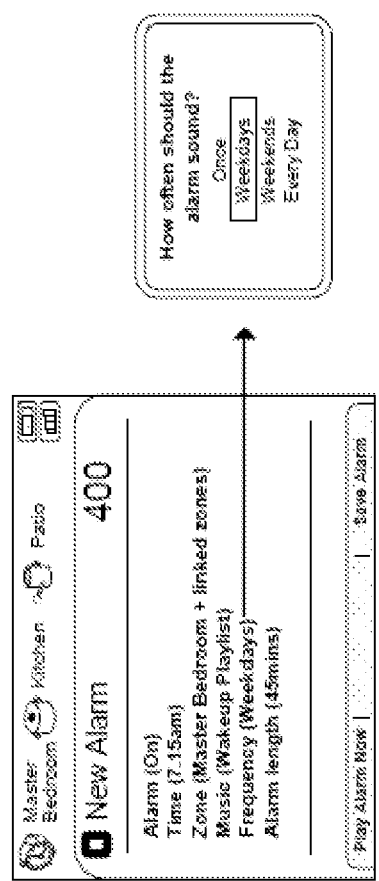
FIG. 4 shows an example user interface that may be displayed on a controller or a computer of FIG. 1.

FIG. 4 shows an exemplary user interface 400 that may be displayed on a controller 142 or a computer 110 of FIG. 1. The interface 400 shows a list of items that may be set up by a user to cause a scene to function at a specific time. In the embodiment shown in FIG. 4, the list of items includes "Alarm", "Time", "Zone", "Music", "Frequency" and "Alarm length". "Alarm" can be set on or off. When "Alarm" is set on, "Time" is a specific time to set off the alarm. "Zone" shows which zone players are being set to play a specified audio at the specific time. "Music" shows what to be played when the specific time arrives. "Frequency" allows the user to define a frequency of the alarm. "Alarm length" defines how long the audio is to be played. It should be noted that the user interface 400 is provided herein to show some of the functions associated with setting up an alarm. Depending on an exact implementation, other functions, such as time zone, daylight savings, time synchronization, and time/date format for display may also be provided.

According to one embodiment, each zone player in a scene may be set up for different alarms. For example, a "Morning" scene includes three zone players, each in a bedroom, a den, and a dining room. After selecting the scene, the user may set up an alarm for the scene as whole. As a result, each of the zone players will be activated at a specific time.

Figure 5A:
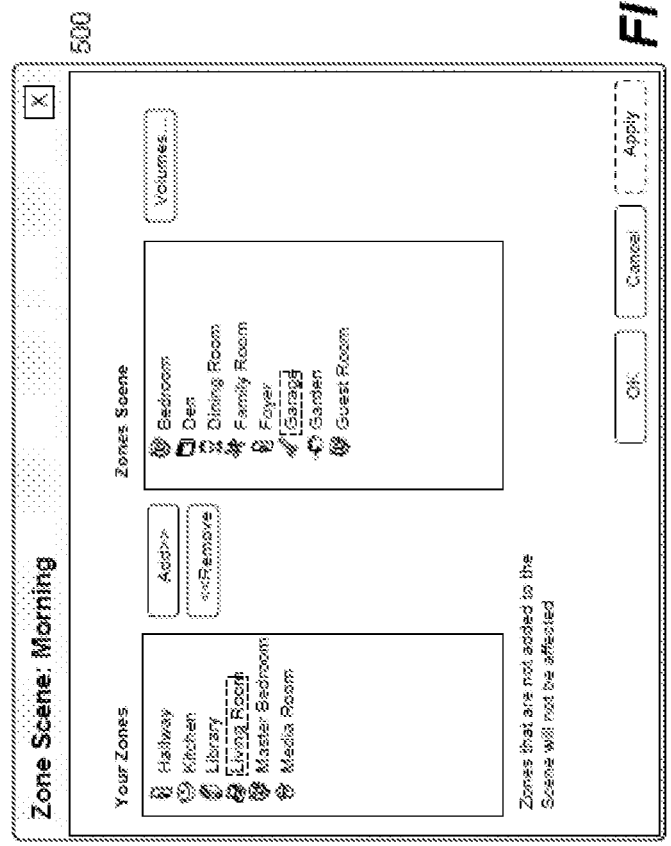
FIG. 5A shows an example user interface to allow a user to form a scene.

FIG. 5A shows a user interface 500 to allow a user to form a scene. The panel on the left shows the available zones in a household. The panel on the right shows the zones that have been selected and be grouped as part of this scene. Depending on an exact implementation of a user interface, Add/Remove buttons may be provided to move zones between the panels, or zones may be dragged along between panels.

Figure 5B:
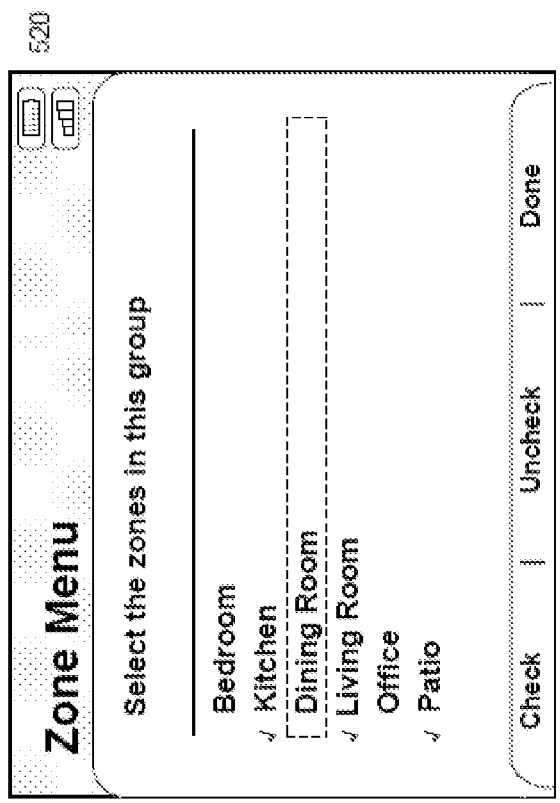
FIG. 5B shows another example user interface to allow a user to form a scene.

FIG. 5B shows another user interface 520 to allow a user to form a scene. The user interface 520 that may be displayed on a controller or a computing device, lists available zones in a system. A checkbox is provided next to each of the zones so that a user may check in the zones to be associated with the scene.

Figure 5C:
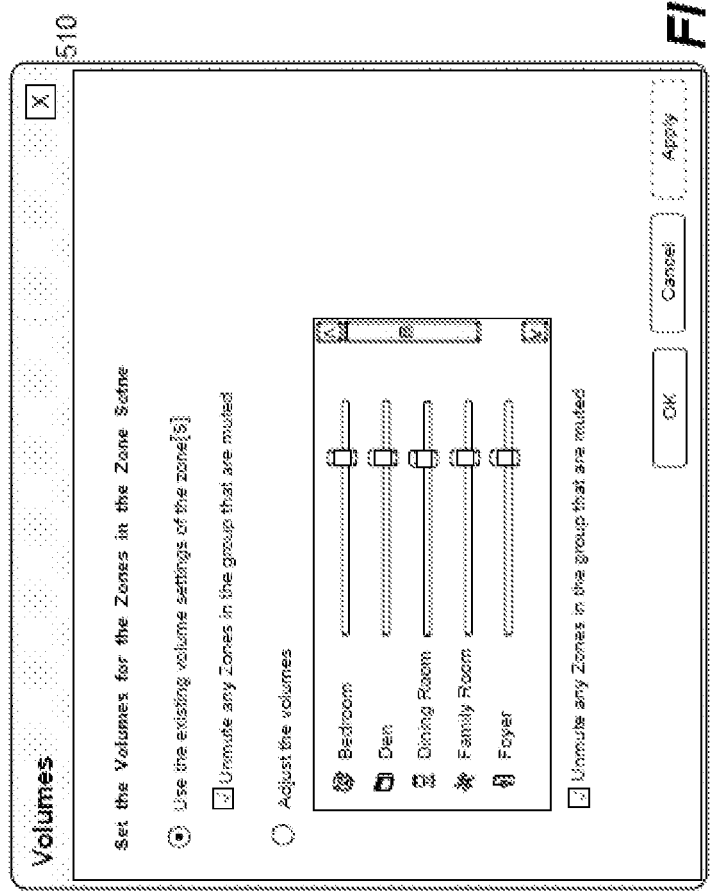
FIG. 5C shows an example user interface to allow a user to adjust a volume level of the zone players in a zone scene individually or collectively.

FIG. 5C shows a user interface 510 to allow a user to adjust a volume level of the zone players in a zone scene individually or collectively. As shown in the user interface 510, the 'Volumes . . . ' button (shown as sliders, other forms are possible) allows the user to affect the volumes of the associated zone players when a zone scene is invoked. In one embodiment, the zone players can be set to retain whatever volume that they currently have when the scene is invoked. Additionally the user can decide if the volumes should be unmuted or muted when the scene is invoked.

V. Providing Example Player Themes or Zone Scenes

Figure 6:
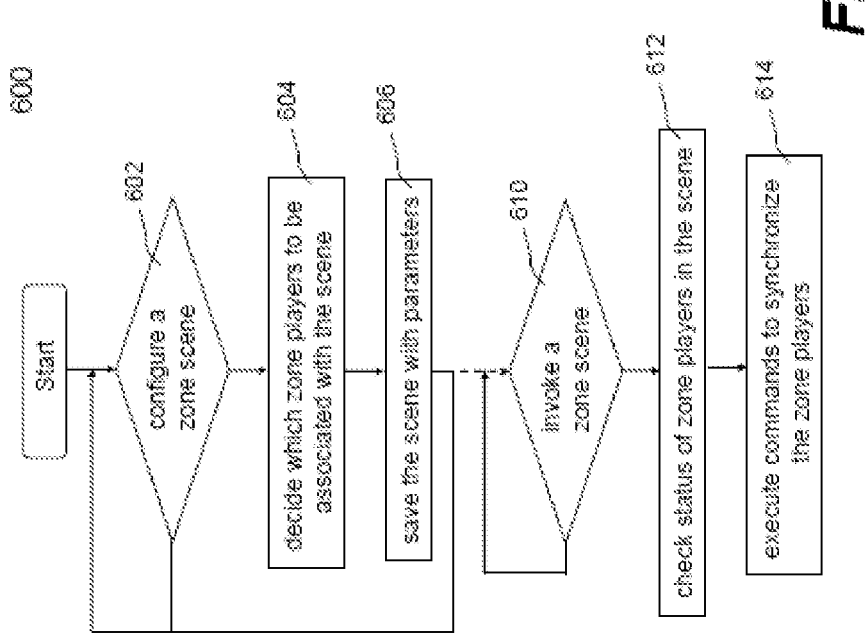
FIG. 6 shows a flowchart or process of providing a player theme or a zone scene for a plurality of players, where one or more of the players are placed in a zone.

FIG. 6 shows a flowchart or process 600 of providing a player theme or a zone scene for a plurality of players, where one or more of the players are placed in a zone. The process 600 is presented in accordance with one embodiment of the present invention and may be implemented in a module to be located in the memory 282 of FIG. 2C.

The process 600 is initiated when a user decides to proceed with a zone scene at 602. The process 600 then moves to 604 where it allows a user to decide which zone players to be associated with the scene. For example, there are ten players in a household, and the scene is named after "Morning". The user may be given an interface to select four of the ten players to be associated with the scene. At 606, the scene is saved. The scene may be saved in any one of the members in the scene. In the example of FIG. 1, the scene is saved in one of the zone players and displayed on the controller 142. In operation, a set of data pertaining to the scene includes a plurality of parameters. In one embodiment, the parameters include, but may not be limited to, identifiers (e.g., IP address) of the associated players and a playlist. The parameters may also include volume/tone settings for the associated players in the scene. The user may go back to 602 to configure another scene if desired.

Given a saved scene, a user may activate the scene at any time or set up a timer to activate the scene at 610. The process 600 can continue when a saved scene is activated at 610. At 612, upon the activation of a saved scene, the process 600 checks the status of the players associated with the scene. The status of the players means that each of the players shall be in condition to react in a synchronized manner. In one embodiment, the interconnections of the players are checked to make sure that the players communicate among themselves and/or with a controller if there is such a controller in the scene.

It is assumed that all players associated with the scene are in good condition. At 614, commands are executed with the parameters (e.g., pertaining to a playlist and volumes). In one embodiment, data including the parameters is transported from a member (e.g., a controller) to other members in the scene so that the players are caused to synchronize an operation configured in the scene. The operation may cause all players to play back a song in identical or different volumes or to play back a pre-stored file.

VI. Example Multi-Channel Environments

Figure 7:
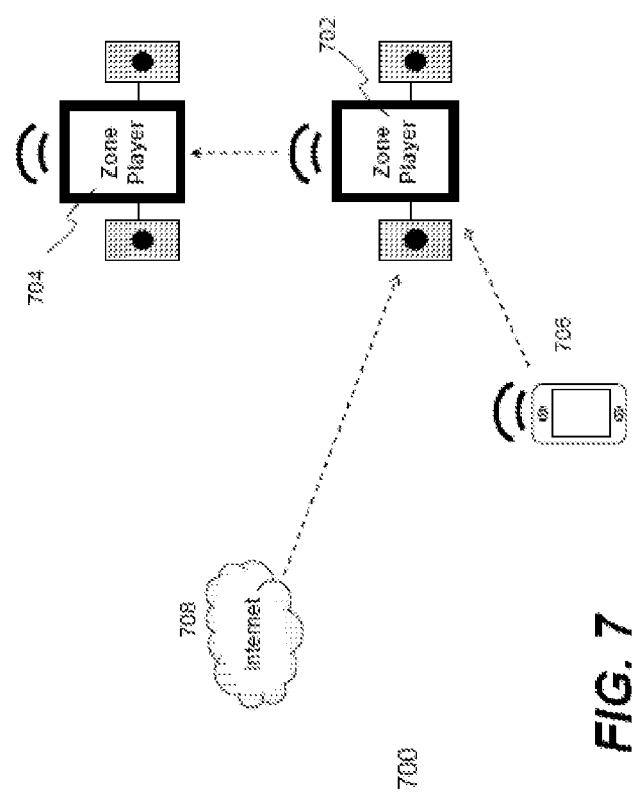
FIG. 7 shows an illustrative configuration in which an audio source is played back on two players in accordance to an embodiment.

FIG. 7 shows an example configuration in which an audio source is played back on two players 702 and 704, according to an example embodiment. These two players 702 and 704 may be located in and around one place (e.g., a hall, room, or nearby rooms) and are designated to play two sound tracks respectively. For example, an audio source may have left and right sound channels or tracks (e.g., stereo sound). Instead of grouping the players 702 and 704 to play back the audio source together in synchrony, where each player 702 and 704 plays the same audio content at substantially the same time, the players 702 and 704 can be paired to play different channels of the audio source in synchrony. As a result of pairing, the stereo sound effects can be simulated or enhanced via two players 702 and 704 versus one player or none of the players, for example.

In certain embodiments, each player of players 702 and 704 includes a network interface, one or more speaker drivers (two or more speaker drivers in some instances, such as when the player can play in stereo mode absent pairing), an amplifier, and a processor, such as shown in FIG. 2A. The network interface receives audio data over a network. One or more amplifiers power the speaker drivers. The processor processes the audio data to be output through the speaker drivers. The processor may further configure a first equalization of the output from the speaker drivers in accordance with a first type of pairing and configuring a second equalization of the output from the speaker drivers in accordance with a second type of pairing.

In an embodiment, the two players 702 and 704 are configured to output a plurality of audio channels independent of each other. For example, each player 702 and 704 may be configured to output audio content in stereo independently from each other. Subsequent to pairing, one playback device (e.g., player 702) is configured to output a first subset of the plurality of audio channels and the other playback device (e.g., player 704) is configured to output a second subset of the plurality of audio channels. The first and second subsets are different. In this example, subsequent to pairing players 702 and 704, player 702 might play the right channel and player 704 might play the left channel. In another example, player 702 might play the right channel plus a center channel (e.g., in television or theater mode) and player 704 might play the left channel plus the center channel. Even in the latter example, the first and second subsets are different in that player 702 is playing channels Right+Center and player 704 is playing channels Left+Center. In yet another embodiment, subsequent to pairing, player 702 might play all channels except certain bass frequencies, which may be played via player 704, thereby using player 704 as a subwoofer.

In another embodiment, a collection of three or more playback devices (e.g., players 702, 704, and one or more additional players) are each configured to output a plurality of audio channels independent of another playback device in the collection. Subsequent to pairing, each of the playback devices is configured to output a generally different audio channel(s) from the collection. This embodiment is particularly useful in a television or movie theater setting where a particular playback device of the multiple playback devices is configured to output in two-channel or stereo mode at one time (e.g., when playing a song), and subsequent to pairing, is configured to output as a front-right channel, a front-center channel, a front-left channel, a rear-right channel, a rear-left channel, and so on (e.g., when watching a movie or television).

In another embodiment, one of the paired playback devices (e.g., player 702 or player 704) processes the data of the audio item, essentially separating the data into channels, each of the channels representing a single-sound track, for example, and being played back in one of the playback devices, thus creating or enhancing a multi-channel listening environment. In an alternative embodiment, both playback devices (e.g., players 702 and 704) may receive and process the data of the audio item and each playback device may output only the audio content designated for the respective player. For example, player 702 might receive both left and right channel audio, but only play the left channel, whereas player 704 might also receive both left and right channel audio, but only play the right channel.

In another embodiment, two or more playback devices (e.g., players 702 or 704) may be grouped into a single or consolidated playback device and the consolidated playback device (e.g., consolidated player 702+704) may be paired with one or more playback devices. For instance, two playback devices maybe grouped into a first consolidated playback device and two additional playback devices maybe grouped into a second consolidated playback device. Then, the first and second consolidated playback devices may be paired to create or enhance a multi-channel listening environment.

In certain embodiments, a playback device (e.g., either player 702 or 704) that is configured to output an audio channel is paired with one or more additional playback devices, such that the playback device is configured to output a different audio channel than previously configured. For instance, the playback device might be configured to output a right channel in stereo mode, but subsequent to being paired with one or more additional playback devices, might be configured to output a rear, right channel in theater mode. The playback device may be paired to one or more other playback devices.

In certain embodiments, a playback device (e.g., either player 702 or 704) that is configured to output a plurality of audio channels is paired with one or more additional playback devices, such that the playback device is configured to output a subset of the plurality of audio channels relative to the one or more additional playback devices. For instance, the playback device might be configured to output in two-channel or stereo mode, but subsequent to being paired with one or more playback devices might be configured to output a right or left channel. The playback device may be paired to one or more other playback devices.

According to certain embodiments, the action of pairing two or more playback devices is triggered based on a command from a user via a control interface (e.g., a manual command) or responsive to an event (e.g., an automatic command). For example, using a controller, a user can create a pairing between two or more playback devices or disengage the pairing between two or more playback devices. In another example, pairing may be triggered by the audio content itself, a signal received from a source device, or some other predefined event, such that pairing occurs when the event is detected by the controller or playback device, for example. In addition, another device might be programmed to detect the event and provide a pairing signal to the controller and/or playback devices.

Further, it is understood that going from a configuration of no pairing (unpaired or non paired) to a configuration of pairing or from one kind of pairing (e.g., a pairing used in a type of stereo mode or theater mode) to a different kind of pairing (e.g., another pairing used in a type of stereo mode or theater mode) are all various types of "pairing" that can occur according to certain embodiments. In addition, disengaging a pairing between multiple playback devices might go from pairing to no pairing or from pairing of a first kind back to pairing of a previous kind, for example.

In one example, a first type of pairing might include "no pairing" with another playback device and a second type of pairing might include pairing with one or more additional playback devices. In a second example, a first type of pairing might include pairing with a second playback device and a second type of pairing might include pairing with a plurality of playback devices. In a third example, a first type of pairing might include reproducing two channel sound via the speaker drivers and a second type of pairing comprises reproducing no more than one channel of the two channel sound via the speaker drivers. In a fourth example, a first type of pairing might comprise reproducing a first audio channel via the speaker drivers and the second type of pairing might include reproducing a second audio channel via the speaker drivers. In a fifth example, a first type of pairing might include reproducing the audio content via the speaker drivers in stereo mode and a second type of pairing might include reproducing the audio content via the speaker drivers in theater mode. In a sixth example, a first type of pairing might include reproducing the audio content via the speaker drivers and a second type of pairing comprises reproducing the audio content via the speaker drivers when in consolidated mode. It is understood that various variations and modifications may be made to the examples described just above with the attainment of some or all of the advantages of the technology described herein.

According to certain embodiments, the configuration of a playback device may include any of: changing the equalization of the playback device by changing the equalization of one or more specific speaker drivers and optimizing the synchronization between paired devices. Changing the equalization of the playback device might include any of: turning on or off (or effectively muting) one or more specific speaker drivers, changing the channel output of one or more speaker drivers, changing the frequency response of one or more specific speaker drivers, changing the amplifier gain of any particular speaker driver, changing the amplifier gain of the playback device as a whole.

In certain embodiments, changing the equalization of a playback device (e.g., changing the equalization of one or more speaker drivers of the playback device) may affect frequency dependent parameters. Examples might include the adjustment of the strength of frequencies within the audio data, a phase adjustment, and time-delay adjustment. In addition, a particular equalization may use a first type of pass filter, such as one that attenuates high, middle, or low frequencies, for example, while allowing other frequencies to pass unfiltered (or substantially unfiltered). Filters might also be different kinds or of a different order (e.g., first order filter, second order filter, third order filter, fourth order filter, and so on). For example, a first equalization of a playback device might include using a first type of pass filter to modify the output based on a first type of pairing and a second equalization of the playback device might include using a second type of pass filter to modify the output based on the second type of pairing. In this example, the first and second type of pass filters have one or different properties and/or behaviors, thus changing the equalization and sonic behavior of the device.

By way of illustration, when two S5 devices are paired to create a stereo pair, for example, one S5 device may be configured as the "left" and the other S5 device may be configured as the "right." In one embodiment, the user may determine which is left or right. In this configuration, for example, the left and right audio data may be sent to both S5 devices, but the left audio data of the track is played out of the S5 device configured as left and the right audio data of a track is played out of the S5 device configured as right. In addition, the equalization of each S5 device is changed in an attempt to reduce or eliminate certain constructive or destructive interference. For example, one tweeter on each S5 device may be turned off or substantially muted. In certain embodiments, the crossover frequency to each driver may even be changed from a previous configuration so that two or more drivers are not necessarily outputting the exact same audio data, otherwise constructive and/or destructive interference may occur. In certain embodiments, the amplifier gain is adjusted for a particular speaker driver and/or for the playback device as a whole.

In operation, according to certain embodiments, a controller 706 (e.g., a controller 142 of FIG. 1 or 240 of FIG. 2B or a portable device) is used to initiate the operation. Through a user interface, the controller 706 causes a player 702 to retrieve the audio source, provided the audio source is on a network 708 (e.g., the Internet or a local area network). Similarly, the controller 706 may also cause a designated device (e.g., another networked device) to establish a communication session with the player 702 to deliver the requested audio source. In any case, either one or both of the players 702 and 704 may have access to the data representing the audio source.

In certain embodiments, a module in the player 702 is activated to process the data. According to one embodiment, the right and left sound tracks are separated. One sound track is retained locally in one player and the other sound track is pushed or uploaded to the other device (e.g., via an ad-hoc network). When the right and left sound tracks are played back simultaneously or substantially simultaneously, the stereo sound effect can be appreciated.

In another embodiment, several tracks are separated, such as in television or theater mode. For example, the tracks may be separated into a center channel, right front channel, left front channel, right rear channel, left rear channel, and so on. Accordingly, one or more sound tracks may be retained locally in one player and the other sound tracks are pushed or uploaded to the other devices.

In yet another embodiment, one player might process the data and retain one or more tracks locally, while the remaining data is sent onto another player. The receiving player may then process the data and retain one or more tracks locally and send any remaining data onto another player. This process, or one like it, may continue until all of the tracks are retained locally by corresponding player devices.

In yet another embodiment, each player might receive and process the data and play only the channel or channels that are designated for that player.

In certain embodiments, it is important to maintain good synchronization, especially when pairing two or more independently clocked playback devices so that the multi-channel audio content is played back as it was originally intended. According to an embodiment, a message may be initiated from one device to another that is also activated to send back an acknowledgement. Upon receiving the acknowledgement, the time delay in transporting data from one device to another can be measured. The time delay will be considered when synchronizing the two players to play back the two separated sound tracks. In certain embodiments, if sending a packet (e.g., a packet in accordance with SNTP protocol) to a playback device and receiving a response takes more than fifteen milliseconds, for example, the timing information contained within that packet, such as clock information, is discarded. If sending and receiving a packet is less than fifteen milliseconds, then the information from the packet is used to adjust playback, if so necessary.

Additional details of synchronizing operations of two or more independently clocked players are provided in commonly assigned US application Ser. No. 10/816,217, filed Apr. 1, 2004, entitled "System and Method For Synchronizing Operations Among A Plurality Of Independently Clocked Digital Data Processing Devices" which is hereby incorporated by reference.

Figure 8:
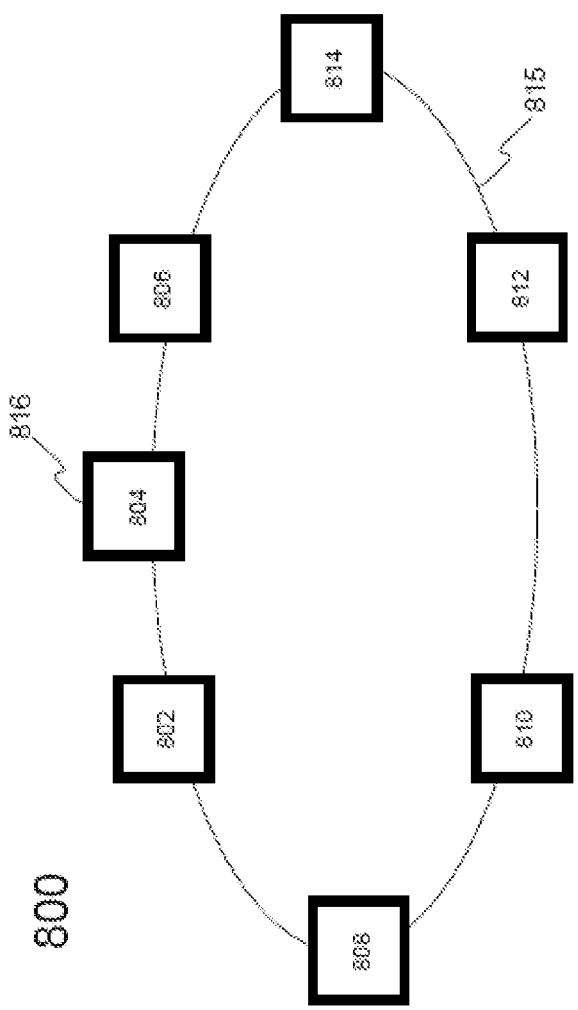
FIG. 8 shows an illustrative configuration of a pairing amongst multiple players in accordance to an embodiment.

FIG. 8 shows an example configuration of a pairing amongst multiple players 802, 804, 806, 808, 810, and 812 in a theater-like environment, in accordance to an embodiment. Player 802 may operate as a front-left channel, player 804 may operate as a center channel, player 806 may operate as a front-right channel, player 808 may operate as a subwoofer, player 810 may operate as a rear, right channel, and player 812 may operate as a rear, right channel. In this example, the players 802, 804, 806, 808, 810, and 812 are wirelessly coupled over network 816 so as to receive and transmit data over a wireless network, and obtain power from power outlets in the wall or through some other power source (e.g., a battery). Players 802, 804, 806, 808, 810, and 812 may be wired, if so configured in an alternate embodiment. Controller 814 may be a network-enabled device, examples of which include a smart phone, tablet computer, laptop computer, desktop computer, or a television.

In one embodiment, a designated player, such as player 804, receives multi-channel audio content from a source 816. Source 816 might include audio and/or video content downloaded or streamed from the Internet, a DVD or Blu-Ray player, or from some other source of audio and/or video content. Player 804 separates the multi-channel audio and sends respective audio channels to its playback owner. For example, if a particular audio channel is designated for the front, right speaker, then that content is wirelessly directed from player 804 to player 802, and so on. Players 802, 804, 806, 808, 810, and 812 play the audio content synchronously, so as to create a multi-channel listening environment. Moreover, if source 816 provides video content along with audio content, then the audio content is preferably played in synchrony with the video content.

In another embodiment, each player of players 802, 804, 806, 808, 810, and 812 may separate out its own one or more channels for playback. That is, either all audio content, or a portion thereof, is sent to each player (e.g., from source 816 or another playback device) and the player itself obtains its own data for playback.

In addition, players 802, 804, 806, 808, 810, and 812 may be reconfigured to operate in many different configurations, such as described above. For example, players 802 and 806 may be paired to operate in stereo mode, while the other players remain in sleep mode or turned off (player 808 may remain on in any particular configuration, if so desired and configured, because it is operating as a subwoofer). In another example, players 802 and 810 may be consolidated and output left channel audio, while players 806 and 812 may be consolidated and output right channel audio. In yet another example, some of players 802, 804, 806, 808, 810, and 812 are consolidated into a single player and paired with additional playback devices, such as in an adjacent room. In a further example, players 802, 804, 806, 808, 810, and 812 are grouped and not paired, when the audio content is music (versus movie content, for example). These are just some configuration examples. Many other configurations are possible using the teachings described herein.

Figure 9:
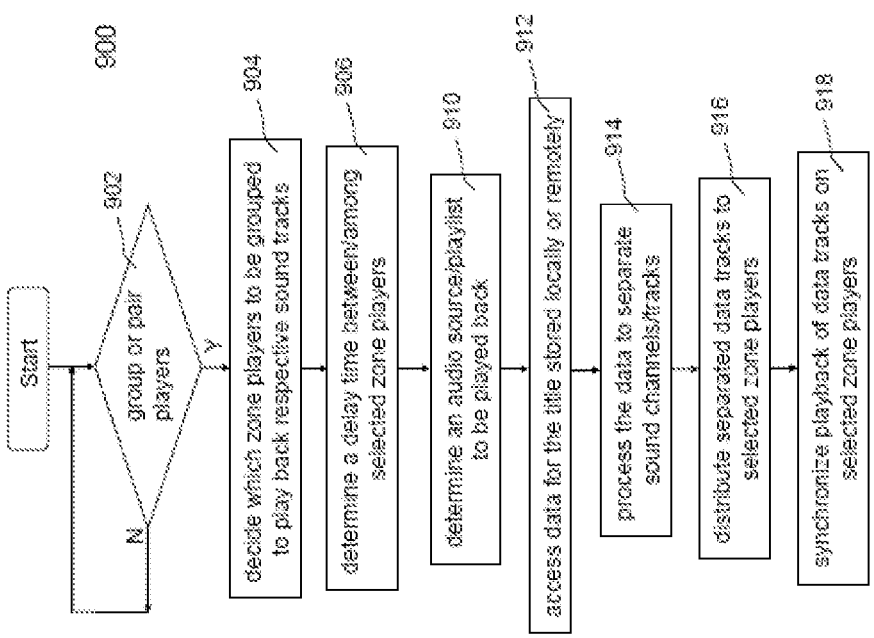
FIG. 9 shows a flowchart or process of grouping a plurality of audio products to play separated sound tracks in synchronization to simulate a multi-channel listening environment.

FIG. 9 shows a flowchart or process 900 of grouping a plurality of audio products to play separated sound tracks in synchronization to simulate a multi-channel listening environment. The process 900 is presented in accordance with certain embodiments and may be implemented in a module to be located in the memory 282 of FIG. 2D. To facilitate the description of process 900, a listening environment of stereo sound with left and right channels is described. Those skilled in the art can appreciate that the description can be equally applied to other forms of multi-channel listening environment (e.g., three, five, seven channel environments).

Typically, there is a plurality of players being controlled by one or more controllers, where these players are disposed in various locations. For example, there are five players in a house; three of them are respectively disposed in three rooms while two players are disposed in a larger room. Accordingly, these two players would be candidates to be paired to simulate a stereo listening environment, instead of just playing synchronized audio from both in a grouped fashion. In another example, there are four players in a large space or adjacent spaces, two pairs of the players may be paired to simulate a stereo listening environment, in which two players in one consolidated pair can be grouped to play back one (left) sound track and the other two in the other consolidated pair can be grouped to play back one (right) sound track.

In any case, two groups of players or two players are decided to be paired at 902. If no players are paired, the process 900 will not be activated. It is assumed that two players from a group of players being controlled by a controller are selected to be paired at 902. The process 900 proceeds.

At 904, a user may decide which player is to play back which sound track. Depending on the location of the user or listener(s) with respect to the selected players, it is assumed that a player or unit A is chosen to play back a left sound track and another player or unit B is chosen to play back a right sound track. In an alternative embodiment, the players themselves (or the controller) may automatically determine which unit is configured to play the right channel and which unit is configured to play the left channel without input from the user.

According to one embodiment, a time delay in transporting data between the two units A and B is measured at 906. This time delay may facilitate sound synchronization between the two units as one of the units will receive a processed sound track from the other. The user may continue to operate on a controller to select a title (e.g., an audio source or an item from a playlist) for playback on the two units at 910.

Once the title is determined at 912, the data for the title is accessed. Depending on where the data is located, the controller may be configured to cause one of the two units to obtain or stream in the data. In one embodiment, the controller or unit A initiates a request to a remotely-networked device providing or storing the data. Assuming an authentication procedure, if any, completes successfully, the remote device starts to upload the data to the unit A. Likewise, if the data is locally stored in the unit A, the data can be accessed locally without requesting the same from the network. As the data is being received or accessed in the unit A, a processing module is activated in the unit A to process the data, essentially separating the data into two streams of sound tracks at 914. In an alternative embodiment, each unit may receive and process the data, essentially separating the data into a stream to be played by the respective unit.

At 916, one of the streams is uploaded from the unit A to unit B via a local network (e.g., the ad-hoc network formed by all the players being controlled by the controller). As the streams are being distributed, the two units are configured to play back the streams respectively, each reproducing the sound of a single sound track at 918. Together, in synchrony, the two units create a stereo sound listening environment.

It should be noted that the delay time, if noticeable, may be incorporated into the unit A to delay the consumption of the stream by the delay time to synchronize with the unit B. Alternatively, a non-selected player may be used to process a streaming data of the title and configured to supply two streams to the pair of players, thus equalizing the delay time that would be otherwise experienced by the unit B.

FIGS. 10A-10F show illustrative screenshots of a controller for creating a stereo pair in accordance with certain embodiments. The screenshots are from a computing device (e.g., a tablet computer, laptop, or desktop) used as a controller. Those skilled in the art can appreciate that FIGS. 10A-10F may be readily modified to be used in a portable device with network capability, such as, for example, iPhone or iTouch or other smart phone or other network-enabled devices. Additionally, the controller might exist as part of a player itself or directly/indirectly coupled to the player, and therefore such screenshots may be modified accordingly—such a controller need not have network capability as the player will have network connectivity.

Figure 10A:
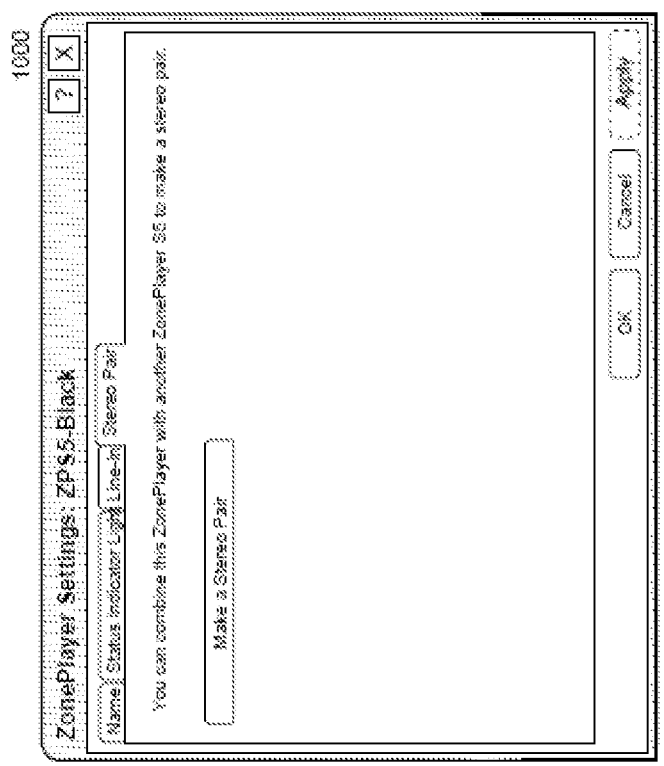
FIGS. 10A to 10F show example snapshots of a controller used in certain embodiments.

FIG. 10A shows a graphic interface 1000 that may be displayed on a controller when a user desires to create a stereo pair with two players in a system. It is understood that the system may include two or more players. If a stereo pair is desired, such as discussed with respect to the example of FIGS. 10A-10F, then any two players (one or both of which may be a consolidated player) in the system may be paired. However, if pairing more than two players is desired, such as creating an environment which is capable of playing more than two channel audio data, then the graphic interface 1000 may include an additional option or options. For example, an option might include "Make a Movie Surround Sound Pairing," "Make a Music Surround Sound Pairing," or "Make a Dolby Pro Logic Pairing." Any descriptive language may be used to appropriately indicate to the user the type of pairing that can be created. Upon selecting an option, a setup wizard on the controller may help the user appropriately configure the system such that multi-channel discrete audio may be effectively realized by the system.

Turning back to FIG. 10A, the interface 1000 allows a user to initiate a stereo pair with a zone player named "ZPS5-Black." In certain embodiments, the system recognizes that ZPS5-Black is part of a particular zone (e.g., kitchen, family room, bedroom, and so on). The system may allow the user to pair ZPS5-Black with another player in the same zone only, or alternatively, the system may allow the user to pair ZPS5-Black with another player in a different zone (such as an adjacent zone). Pairing players in different zones may be particularly useful when an open space is divided into two or more zones (e.g., an open space might include a kitchen and family room, for example).

Additionally, the system may be programmed such that pairing players from different zones creates another zone to reflect the players in paired mode (e.g., a single kitchen-family room zone during paired operation might originate from a kitchen zone and a family room zone during non-paired operation). In such an embodiment, a user may be able to switch between zones or dynamically create new zones.

Figure 10B:
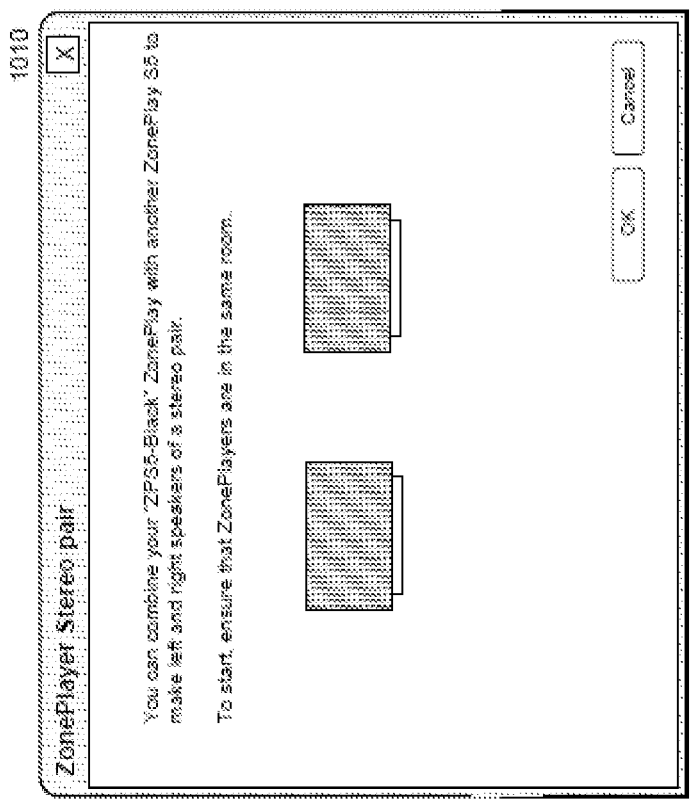

In certain embodiments, if another similar player is available to be paired, then the screenshot of FIG. 10B may be displayed. If the user wishes to continue with creating a pair, then the user may select "OK." If not, then the user may select "Cancel." In another embodiment, a different player (e.g., a player that is not an S5) may be paired together. That is, different types of players may be paired, if the players are so designed to be paired. To accommodate the differences in player type, the equalization of one or more players may be adjusted accordingly to compensate for things like the number and size of speaker drivers used in one player versus the other player. In yet another embodiment, a list of the players in the system may be displayed (not shown), from which the user selects two or more players to make the stereo pair. The list of players may be automatically determined by the system based on a player's particular location within a home, room, or configuration with other players within a room, for example.

Figure 10C:
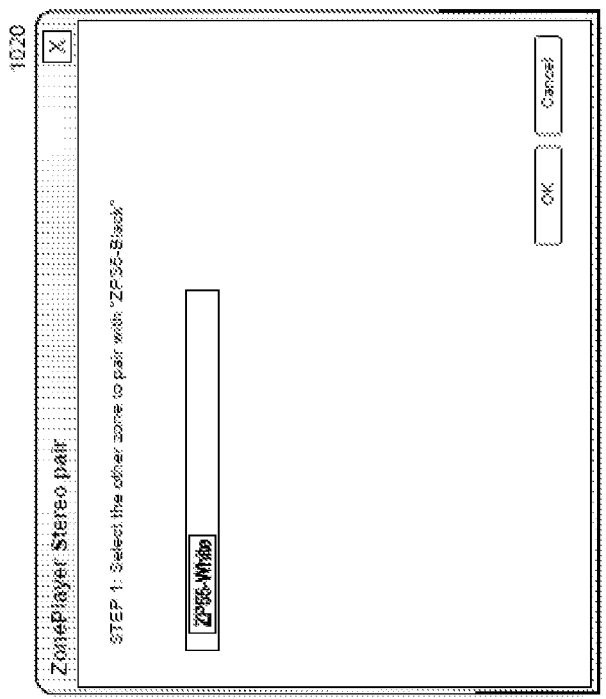

Turning now to FIG. 10C, in this example, it is assumed that the user may select a zone player named "ZPS5-White" to be paired with "ZPS5-Black" to create a stereo pair. If so desired, the user may select "OK" to proceed with the pairing. Otherwise, the user may select "Cancel." In certain embodiments, ZPS5-White may be in the same zone as ZPS5-Black. In other embodiments, ZPS5-White may be in a different zone as ZPS5-Black.

Figure 10D:
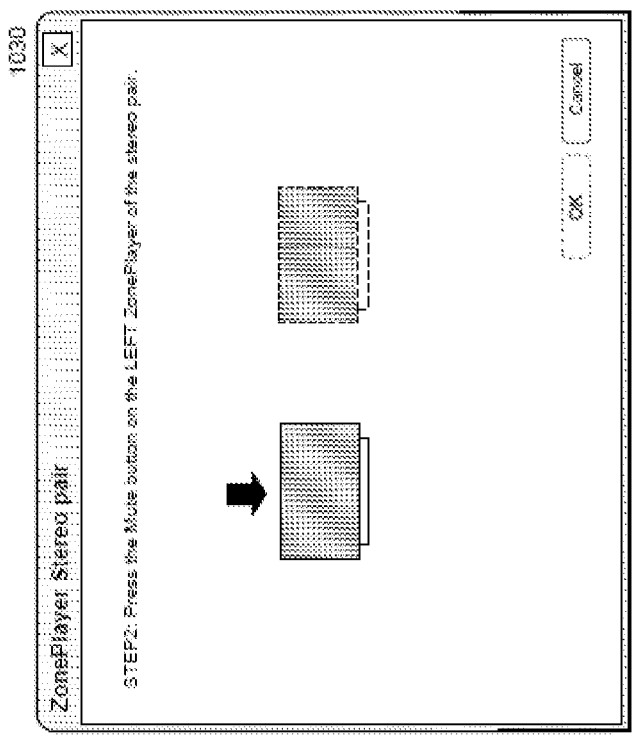
Figure 10E:
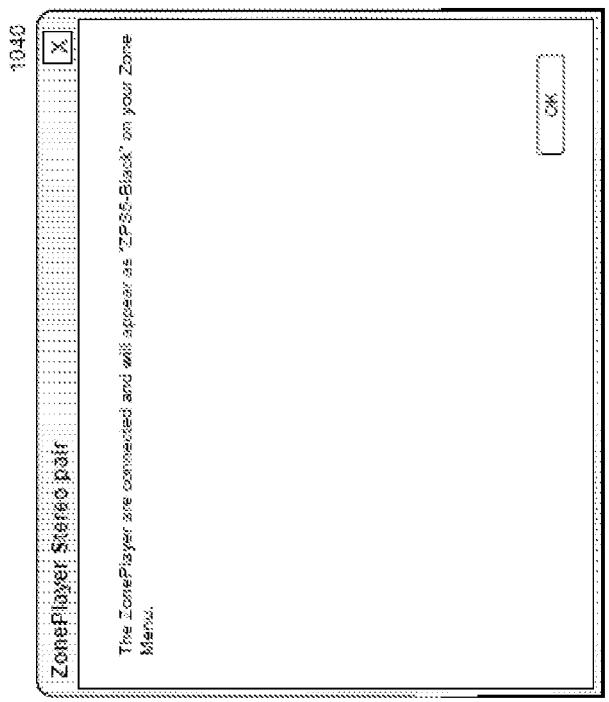
Figure 10F:
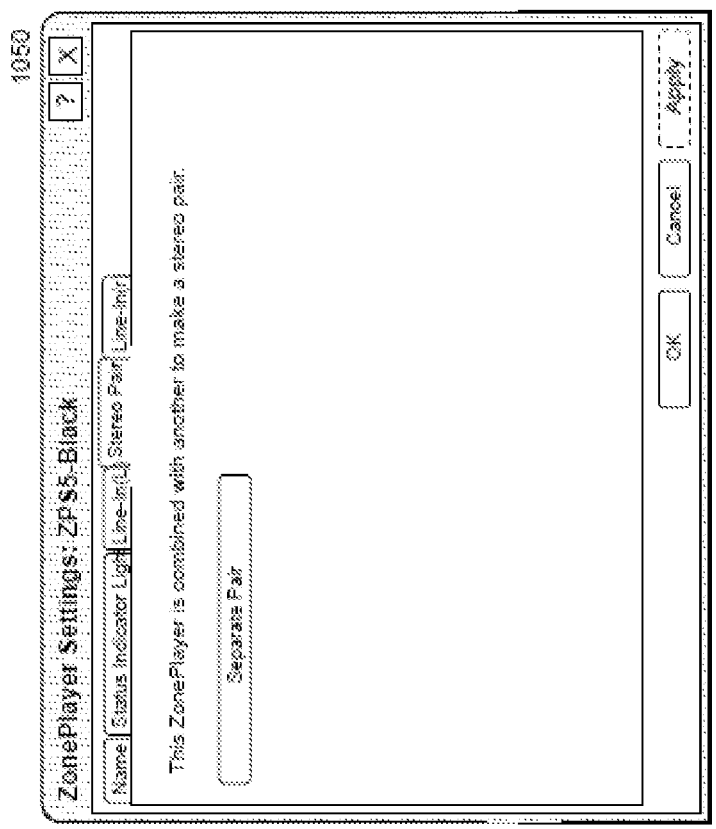

Upon selecting "OK" in FIG. 10C, a screenshot like that of FIG. 10D may be displayed to the user, thereby instructing the user to press the mute button (or some other designated button) on the "LEFT" player of the stereo pair. Further, a light on the players may flash to further indicate that each of the players is a possibility for left channel pairing. Upon selection of the left player, FIG. 10E may be displayed to inform the user that a pair has been created along with a name for the pair, if so desired. Responsively, the system will play the left channel audio from the user designated player and will automatically play the right channel audio from the other player. FIG. 10F provides an example screenshot to allow the user to separate the stereo pair if so desired.

In an alternative embodiment, the creation of a stereo pair may be an option for a particular zone or a number of zones (e.g., a household of zones). For example, an option like "Create a Stereo Pair" may exist such that upon selection, a setup wizard may launch asking the user to press a flashing mute button (or some other designated button) on whichever speaker the user wanted to be the left speaker in the zone, a portion of zones, or all of the zones. In one embodiment, flashing would occur for all of the same speaker types. In another embodiment, flashing would occur for all speaker types that are capable of being paired. After choosing the left speaker, the wizard screen would ask the user to do the same for the right speaker. Preferably, only the speakers that are capable of being paired as the right speaker are flashing so as to appropriately narrow the choices for the user.

Additionally, in one embodiment and as shown in FIG. 3A or 3B, a graphic display is provided to show to the user all the players in a system and how they are grouped or named. A nickname for the stereo pair in the display 1040 may be highlighted and would be further displayed in FIG. 3A if FIG. 3A is modified after the stereo pair is complete A similar graphic interface may be used to create a pair in an environment having more than two channels. For example, in a home theater environment, the system may list more than two separate players from which the user can create a pairing by selecting which player is to operate as the front right, center, front left, rear right, and rear left. A subwoofer may also be added to the list, so that it can be integrated into the multi-channel pairing by the user.

As an example, similar to what is described in the various embodiments above with respect to creating a stereo pair, the system may flash an indicator light on all relevant players and a setup wizard may ask the user to select the "front-left," then the "front-right," then the "front-center," then the "rear-left," then the "rear-right," and so on until all of the players are appropriately paired. Preferably, only the speakers that are capable of being paired as the next speaker are flashing so as to appropriately narrow the choices for the user.

VII. Example Smart Line-in Processing

Figure 11:
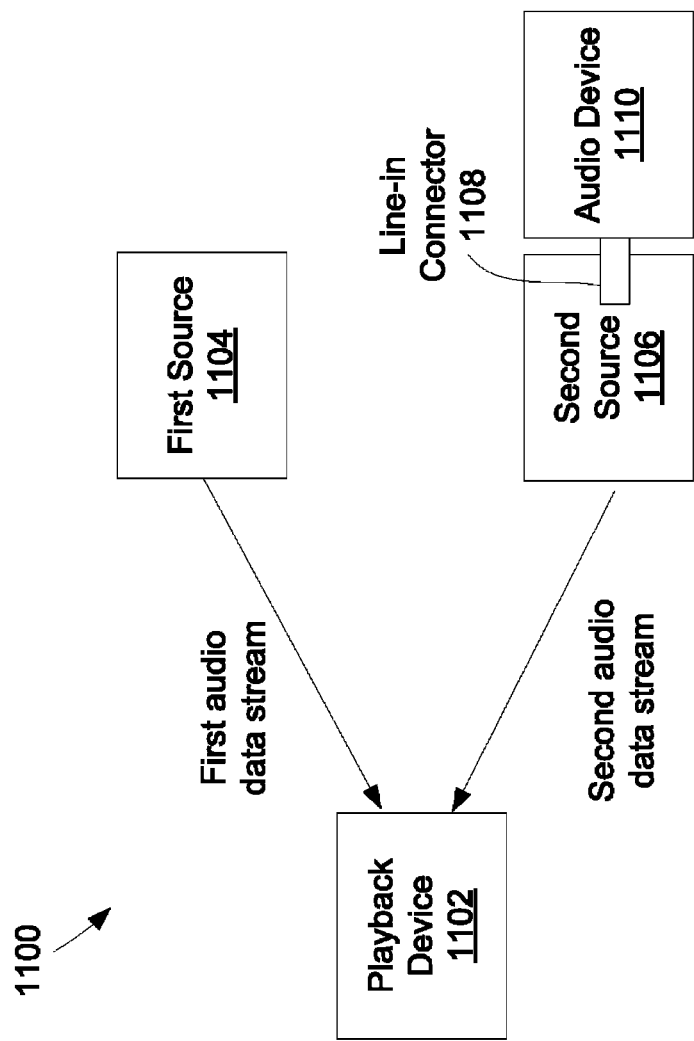
FIG. 11 shows an illustrative configuration of smart in-line processing, in accordance with certain embodiments.

FIG. 11 shows an example configuration of smart line-in processing, in accordance to an embodiment. System 1100 includes a playback device 1102, a first source 1104, a second source 1106 having a line-in connector 1108, and an audio device 1110. The playback device 1102 and any of the first source 1104 and the second source 1106 may be components of a single apparatus (e.g., a single playback device), or the playback device 1102 may be separate from any of the first source 1104 and second source 1106 and communicate with one another, such as over a wired or wireless network. By way of illustration, the playback device 1102 may be a zone player or playback device such as shown in FIGS. 1, 2A, 7, and 8. Additionally, it is understood that first source 1104 and second source 1106 may also each be a playback device, such as described herein.

In certain embodiments, the playback device 1102 is idle and therefore not producing sound. Alternatively, the playback device 1102 is configured to receive and play a first audio data stream from the first source 1104. The playback device 1102 is further capable to receive and play a second audio data stream from the second source 1106. The second source 1106 is coupled to an audio device 1110 through a line-in connector 1108 on the second source 1106. Line-in connector 1108 may include a TRS type connector/socket (e.g., a TRS connector may be referred to as an audio jack, jack plug, stereo plug, mini-jack, and mini-stereo). Other types of connectors may also be used depending on the application. Further, a digital audio connection may be made instead of an analog audio connection. Such as described above, an example audio device 1110 may include a wireless networking device, such as an AirPort Express, which is a product that is commercially offered for sale by Apple, Inc.

A listener (e.g., user of 1100) commands the audio device 1110 to play audio (e.g., via a separate control interface like an iTunes music controller). The second source 1106 is configured, such that when a signal is detected on the line-in connector 1108, the second source 1106 automatically switches the playback device 1102 to play audio from the audio device 1110 via the second audio data stream. The switch to play audio from the audio device 1110 may optionally be performed only after the second source 1106 detects a signal on the line-in connector 1108 for a threshold time (e.g., 300 milliseconds or less). It is understood that the playing of the second audio data stream may override the playing of the first audio data stream, if the playback device 1102 was receiving and/or playing audio from the first source 1104. Additionally, when the playback device 1102 is automatically switched to play audio from the second source 1106, where the second source 1106 receives the audio from the audio device 1110 coupled to the second source 1106 via the line-in connector 1108, the volume of the playback device 1102 is modified to a second volume level. The second volume level is set such that increased dynamic range is given to a volume control of the audio device 1110 connected via line-in to the second source 1106.

In another illustration, the playback device 1102 is configured to receive and play audio from the second source 1106. During play, a listener commands the playback device 1102 via a controller (such as shown in FIG. 2D) to instead play the first audio data stream from the first source 1104. Upon receipt of the command, the playback device 1102 switches to play the first audio data stream. The playback device 1102 subsequently instructs the second source 1106 to stop sending the audio of the audio device 1110 to the playback device 1102. The second source 1106 stops sending the audio to the playback device 1102 and waits until it no longer detects a signal on its line-in connector 1108 for an interval of time. When a signal is not detected on the line-in connector 1108 for the interval of time (e.g., 13 seconds or less), the second source 1106 is ready to automatically switch the playback device 1102 to play audio from the audio device 1110, should the second source 1106 once again detect a signal on its line-in connector 1108. Additionally, when the playback device 1102 switches to play the first audio data stream, the volume of the playback device 1102 is returned to a safe volume level such that the audio is not played back to the listener at a high level. While a high level may be programmed to taste, an example of a safe volume level is less than 100 db.

VII. Conclusion

The components, elements, and/or functionality of the systems discussed above may be implemented alone or in combination in various forms in hardware, firmware, and/or as a set of instructions in software, for example. Certain embodiments may be provided as a set of instructions residing on a computer-readable medium, such as a memory, hard disk, CD-ROM, DVD, and/or EPROM, for execution on a processing device, such as a controller and/or playback device.

Various inventions have been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. While the embodiments discussed herein may appear to include some limitations as to the presentation of the information units, in terms of the format and arrangement, the embodiments have applicability well beyond such embodiment, which can be appreciated by those skilled in the art. Accordingly, the scope of the present invention is defined by the appended claims rather than the forgoing description of embodiments.

We claim:
1. A playback device comprising:
 a line-in connector for receiving a first audio signal;
 a network interface;
 a processor; and
 a non-transitory computer readable storage medium having stored therein instructions executable by the processor to:
  determine whether the first audio signal is present at the line-in connector;
  in response to determining that the first audio signal is present at the line-in connector, (i) cease playback of a second audio signal being played by the playback device, wherein the second audio signal is not present at the line-in connector, and (ii) cause the playback device to play the first audio signal;
  receive, via the network interface, a first instruction to stop the playback device from playing the first audio signal while the first audio signal is still present at the line-in connector;
  determine that the first audio signal is no longer present at the line-in connector; and
  in response to determining that the first audio signal is no longer present at the line-in connector, arm the playback device such that a subsequent presence of the first audio signal at the line-in connector causes the playback device to play the first audio signal.

2. The playback device of claim 1 wherein the network interface is configured to transmit the audio data over a network to another playback device.

3. The playback of claim 1 further comprising a network interface to facilitate communication on a network, wherein the network interface is configured to receive the instruction.

4. The playback device of claim 1, wherein the instructions are further executable by the processor to determine that the first audio signal is present at the line-in connector for a threshold time before causing the playback device to play the first audio signal.

5. The playback device of claim 1, wherein the instructions are further executable by the processor to determine that the first audio signal is no longer present at the line-in connector for an interval period before responsively arming.

6. The playback device of claim 1 further comprising an amplifier for powering one or more speaker drivers.

7. The playback device of claim 1, wherein the instructions are further executable by the processor to modify a volume level of the playback device to a predetermined volume when the playback device plays the first audio signal.

8. The playback device of claim 1, wherein the instructions are further executable by the processor to modify a volume level of the playback device to a predetermined volume when the playback device plays the second audio signal.

9. The playback device of claim 1, wherein the first audio signal is received from an audio device, and wherein the audio device is controllable independent of the playback device.

10. A tangible computer-readable storage medium including instructions which, when executed by a processor, implement a method for providing audio to a playback device, the method comprising:
- determining whether a first audio signal is being received via a line-in connector of a playback device;
- in response to determining that the first audio signal is being received via the line-in connector, (i) ceasing playback of a second audio signal being played by the playback device, wherein the second audio signal is not being received via the line-in connector, and (ii) receiving, via a network interface of the playback device, a first instruction to stop the playback device from playing the first audio signal while the first audio signal is still being received via the line-in connector;
- determining that the first audio signal is no longer being received via the line-in connector; and
- in response to determining that the first audio signal is no longer present at the line-in connector, arming the playback device such that a subsequent reception of the first audio signal via the line-in connector causes the playback device to play the first audio signal.

11. The computer-readable storage medium of claim 10, further comprising determining that the first audio signal has been received for a threshold time before causing the playback device to play the first audio signal.

12. The computer-readable storage medium of claim 10, further comprising determining the second audio signal to be no longer present via the line-in connector for an interval period before responsively arming the playback device.

13. The computer-readable storage medium of claim 10, further comprising modifying a volume level of the playback device to a predetermined volume when the playback device plays the first audio signal.

14. The computer-readable storage medium of claim 10, further comprising modifying a volume level of the playback device to a predetermined volume when the playback device plays the second audio signal.

15. The computer-readable storage medium of claim 10, wherein the first audio signal is received from an audio device, and wherein the audio device is controlled independent of the playback device.

16. A method for providing audio to a playback device, the method comprising:
- determining, using a processor, whether a first audio signal is being received via a line-in connector of a playback device;
    - in response to determining that the first audio signal is being received via the line-in connector, (i) ceasing playback of a second audio signal being played by the playback device, wherein the second audio signal is not being received via the line-in connector, and (ii) receiving, via a network interface of the playback device, an instruction to stop the playback device from playing the first audio signal while the first audio signal is still being received via the line-in connector;
    - determining, using the processor, that the first audio signal is no longer being received via the line-in connector; and
- in response to determining that the first audio signal is no longer present at the line-in connector, arming the playback device such that a subsequent reception of the first audio signal via the line-in connector causes the playback device to play the first audio signal.

17. The method of claim 16, further comprising determining that the first audio signal has been received for a threshold time before causing the playback device to play the first audio signal.

18. The method of claim 16, further comprising determining the first audio signal to be no longer present via the line-in connector for an interval period before responsively arming the playback device.

19. The method of claim 16, further comprising modifying a volume level of the playback device to a predetermined volume when the playback device plays the first audio signal.

* * * * *

UNITED STATES PATENT AND TRADEMARK OFFICE
CERTIFICATE OF CORRECTION

PATENT NO.         : 8,938,312 B2                               Page 1 of 1
APPLICATION NO.    : 13/089167
DATED              : January 20, 2015
INVENTOR(S)        : Nicholas Millington et al.

It is certified that error appears in the above-identified patent and that said Letters Patent is hereby corrected as shown below:

On the title page, under abstract "19 Claims, 22 Drawing Sheets" should read --18 Claims, 22 Drawing Sheets--.

In the Claims

In Column 24, line 43 (Claim 3): Delete "The playback of claim 1 further comprising a network interface to facilitate communication on a network, wherein the network interface is configured to receive the instruction".

In Column 25, line 1 (Claim 10): Delete "tangible" and insert --Non-Transitory--.

Signed and Sealed this
Fifth Day of May, 2015

Michelle K. Lee
*Director of the United States Patent and Trademark Office*